US012783749B1

(12) United States Patent
Pendergrast et al.

(10) Patent No.: US 12,783,749 B1
(45) Date of Patent: Nov. 3, 2026

(54) BEHAVIOR OF SIMULATED OBJECTS IN DRIVING SIMULATIONS

(71) Applicant: Zoox, Inc., Foster City, CA (US)

(72) Inventors: David Michael Pendergrast, Irvine, CA (US); Maxwell Chandler Robinson, San Mateo, CA (US); Tod Cameron Semple, Woodside, CA (US); Kenneth Michael Siebert, Redwood City, CA (US)

(73) Assignee: Zoox, Inc., Foster City, CA (US)

(*) Notice: Subject to any disclaimer, the term of this patent is extended or adjusted under 35 U.S.C. 154(b) by 964 days.

(21) Appl. No.: 17/743,103

(22) Filed: May 12, 2022

(51) Int. Cl.
*G06F 30/20* (2020.01)

(52) U.S. Cl.
CPC .................................... *G06F 30/20* (2020.01)

(58) Field of Classification Search
CPC ....................................................... G06F 30/20
See application file for complete search history.

(56) References Cited

U.S. PATENT DOCUMENTS

| | | | | |
|---|---|---|---|---|
| 10,389,607 | B1 * | 8/2019 | Borovikov | H04L 67/14 |
| 10,649,459 | B2 | 5/2020 | Wang et al. | |
| 10,671,076 | B1 | 6/2020 | Kobilarov et al. | |
| 11,126,534 | B2 * | 9/2021 | Myrand-Lapierre | G06F 30/15 |
| 11,195,418 | B1 | 12/2021 | Hong et al. | |
| 12,291,236 | B1 * | 5/2025 | Akman | B60W 10/20 |
| 2006/0184355 | A1 * | 8/2006 | Ballin | G06F 3/011 704/8 |
| 2013/0063477 | A1 * | 3/2013 | Richardson | G06F 3/012 345/619 |
| 2018/0143644 | A1 | 5/2018 | Li et al. | |
| 2019/0047584 | A1 * | 2/2019 | Donnelly | B60W 50/10 |
| 2019/0129831 | A1 * | 5/2019 | Goldberg | G06F 11/3698 |
| 2020/0139967 | A1 | 5/2020 | Beller et al. | |

(Continued)

FOREIGN PATENT DOCUMENTS

| | | | | |
|---|---|---|---|---|
| CN | 113822693 A | * 12/2021 | | G06Q 10/06393 |
| CN | 108290579 B | * 4/2022 | | G06F 18/24 |

OTHER PUBLICATIONS

Bowen Weng, "A Class of Model Predictive Safety Performance Metrics for Driving Behavior Evaluation", Sep. 2021, IEEE, pp. 180-187 (Year: 2021).*
Kim et al., "Correlated Parameters in Driving Behavior Models", 2011, Northwestern University, Journal of the Transportation Research Board, No. 2249, pp. 62-77 (Year: 2011).*

(Continued)

*Primary Examiner* — Rehana Perveen
(74) *Attorney, Agent, or Firm* — EIP US LLP

(57) ABSTRACT

According to an aspect of the invention, there is provided a system comprising: a processor; and non-transitory memory storing processor-executable instructions that, when executed by the processor, cause the system to perform actions including: receiving a driving log comprising data relating to a real object in a real environment; controlling, in a driving simulation generated based on the driving log, a simulated object corresponding to the real object according to an object model; determining a simulated distribution for a characteristic that is controlled according to the object model, the simulated distribution being based on a value for the characteristic associated with the simulated object based on the driving simulation; determining a real distribution for the characteristic, the real distribution being based on a value for the characteristic associated with the real object based on the driving log; and determining a metric based on the simulated distribution and the real distribution.

20 Claims, 5 Drawing Sheets

(56) References Cited

U.S. PATENT DOCUMENTS

| | | | | |
|---|---|---|---|---|
| 2020/0298891 | A1 | 9/2020 | Liang et al. | |
| 2020/0410062 | A1* | 12/2020 | O'Malley | B60W 60/001 |
| 2021/0089032 | A1 | 3/2021 | Li et al. | |
| 2021/0133582 | A1* | 5/2021 | Refaat | G06N 3/084 |
| 2021/0286925 | A1 | 9/2021 | Wyrwas et al. | |
| 2021/0370972 | A1 | 12/2021 | Bagschik et al. | |
| 2022/0097728 | A1* | 3/2022 | Lin | G06N 20/00 |
| 2022/0116280 | A1* | 4/2022 | Zhang | H04L 43/0888 |
| 2022/0139554 | A1* | 5/2022 | Pillay | G16H 70/20 705/2 |
| 2022/0340149 | A1* | 10/2022 | Nister | B60W 50/0205 |

OTHER PUBLICATIONS

Im et al., "Evaluation Metrics for Behavior Modeling", Jul. 27, 2020, Janelia Research Campus, HHMI, Virginia, pp. 1-17 (Year: 2020).*

United States non-final Office Action dated Nov. 5, 2025 for U.S. Appl. No. 17/743,118.

Chen, Yu, et al. "Mixed test environment-based vehicle-in-the-loop validation-a new testing approach for autonomous vehicles" 2020 IEEE intelligent vehicles symposium (IV). IEEE, 2020, Oct. 20, 2020.

Rosique, Francisca, et al. "A systematic review of perception system and simulators for autonomous vehicles research" Sensors 19.3 (2019): 648. Feb. 5, 2019.

United States non-final Office Action dated Nov. 18, 2025 2025 for U.S. Appl. No. 17/742,136.

United States Final Office Action dated Jun. 29, 2026 for U.S. Appl. No. 17/742,136.

* cited by examiner

BEHAVIOR OF SIMULATED OBJECTS IN DRIVING SIMULATIONS

BACKGROUND

As manual functionality on vehicles is replaced with autonomous controls, the need to test and validate the systems implementing these controls increases. In particular, it is important to test the reaction of the autonomous control to other objects, such as vehicles or pedestrians. It may be desirable to test these reactions in a simulated environment, for example where a real-world scenario is not available or a scenario is too dangerous to test in the real world. It is useful for objects in the simulated environment to accurately represent objects that may be encountered in the real world.

BRIEF DESCRIPTION OF DRAWINGS

The detailed description is described with reference to the accompanying figures. The use of the same reference numbers in different figures indicates similar or identical components or features.

DETAILED DESCRIPTION

Figure 1:
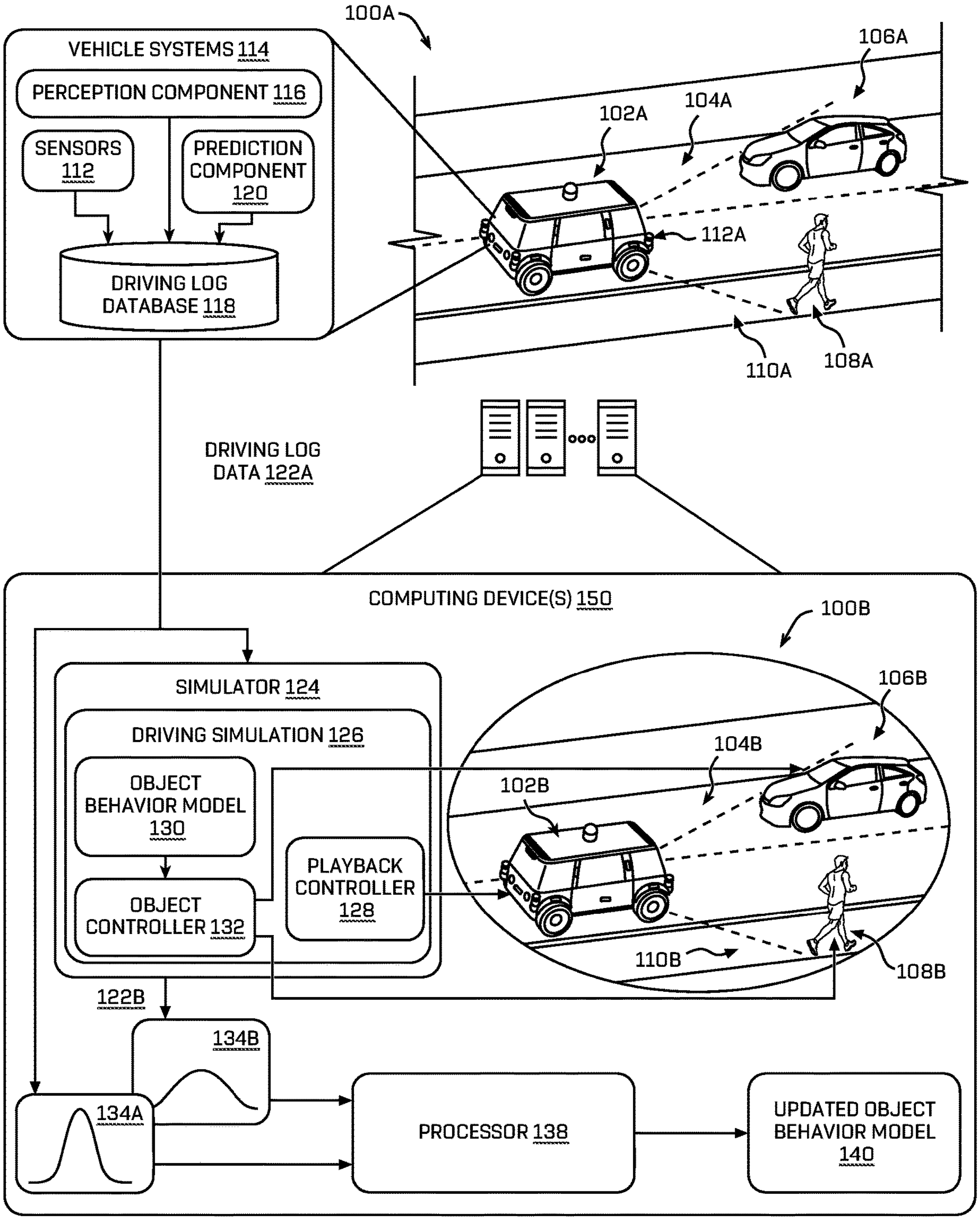
FIG. 1 is a pictorial diagram of a process for improving smart agent behavior in simulations based on driving log data according to embodiments of the present invention.

This application relates to methods, systems, and computer-readable media that improve realism in driving simulations that are used for testing or validating vehicle components or for generating test data. Realism in driving simulations may be improved by improving either the actions of simulated objects within a simulation or the distributions of those simulated objects within the simulation. By actions of simulated objects, it is meant the way in which simulated objects act in relation to their environment and other simulated objects. Distributions may refer to a frequency with which a type of simulated object appears within a simulation or to a spread of expected behaviors, personalities, or actions, such as trajectories, of simulated objects as they interact with their environment or other simulated objects.

The simulated objects may be simulated representations of dynamic objects, which are configured to move within a simulated environment, or simulated representations of static objects, which do not move within the simulated environment. Examples of dynamic objects are two-wheeled vehicles (e.g., bicycle, motorcycle, etc.), four-wheeled vehicles (e.g., car, truck, bus, etc.) or pedestrians. Examples of static objects are parked vehicles or street furniture. These simulated objects may be referred to as 'agents'. By improving the actions or distribution of agents to be more realistic, the realism of the simulation can also be improved. Improving simulations in turn improves operation of autonomous vehicles whose components and software may be designed based on the outcome of one or more simulations.

Dynamic agents within simulations, such as simulated vehicles or pedestrians, may be configured as 'playback agents' or 'smart agents'. Playback agents are agents controlled within the simulation according to data within a driving log so that they do not deviate from the data in the driving log. In other words, playback agents are configured to mimic the actions of a corresponding real-world object navigating a real-world situation, without any independent decision making or control to distinguish their actions from those of the real-world object. Smart agents, in contrast, may be controlled by an object controller and may react to a simulated environment and/or make operating decisions as part of the simulation.

Smart agents may be controlled to mimic or base its own actions on a portion of the actions of a corresponding real-world object and to perform other actions according to the object controller. For example, a smart agent may follow a route that is based on the route followed by the real-world object, but may vary its speed, acceleration, and exact road position along that route according to the control of the object controller. Smart agents may be controlled by the object controller to react or make decisions according to an object model. The object model for smart agents may be referred to as an object behavior model. The object behavior model may specify how one or more smart agents within a simulation should behave. The object behavior model may determine how often a particular behavior or characteristic of one or more smart agents should occur or may specify parameters by which one or more smart agents is to be controlled. The object behavior model may be designed to imitate the way dynamic objects may, from time to time, exhibit anomalous behavior. For example, the object behavior model may cause a simulated vehicle to execute a turn in front of oncoming traffic, swerve suddenly, cross lane markings, execute an illegal maneuver, move at an unlawful speed, and/or the like at a frequency similar to rates at which such things occur in real-world scenarios. The object behavior model may also be designed to imitate more common behaviors of dynamic objects, such as acceleration profiles, speed profiles, braking profiles, aggressiveness, cautiousness, following and stopping distances, time to clear junctions, and details relating to signaling, such as indicator use. The object behavior model may be configured to, for a plurality of smart agents, assign a behavior to each smart agent based on a predetermined distribution of behaviors. In some examples, the object behavior model may specify the way in which a trajectory of a smart agent is to be determined, such that trajectories of smart agents are based in and relative to other behaviors of the smart agent. For example, a smart agent that accelerates quickly, often exceeds the speed limit, and is perceived as particularly aggressive in its actions on the road may take a more direct trajectory than a cautious smart agent. In some examples, behavior of a smart agent may be controlled according to one of a plurality of agent personalities, which specify particular traits that the agent is to exhibit. In some examples, a smart agent may vary its behavior along a route, such that one behavior, set of behaviors, or personality is exhibited for a portion of a route, while another behavior, set of behaviors, or personality is exhibited for another portion of the route. Ensuring that the distribution of behaviors among smart agents is appropriate and realistic is important in enabling the use of simulation in wider testing and validation of vehicles and componentry. An object behavior model may be generated using techniques such as those described in U.S. patent application Ser. No. 16/889,747 which is incorporated herein in its entirety and for all purposes.

An object model may be used to generate simulated representations of static objects. Such an object model may be referred to as an object distribution model. While simulated static objects do not move in the simulated environment, agents and a simulated vehicle may react to and interact with simulated static objects, meaning that the way in which they are simulated is useful. In general, characteristics or behaviors of static objects that influence how dynamic objects may interact with them may be determined with reference to a model and therefore improved to be more realistic. For example, distributions of different types of vehicles in parking lanes, the angles and positions at which they are parked, and vehicle dimensions may be determined by an object model. Improving distributions of simulated static objects to be more realistic may ensure that the simulated environment within which a simulated vehicle or agent is controlled ensures that the simulation and therefore its output is as realistic as possible.

In order to improve realism in simulations, the present invention makes use of one or more driving simulations in which the behavior of at least one of the simulated objects in each of the one or more driving simulations is controlled according to a predefined object model by a controller. The driving simulations may be based on one or more real-world driving logs. Each simulated object may correspond to a real-world object in a driving log. The simulated object may be controlled in a simulated environment that corresponds to a real-world environment in a driving log. A plurality of driving simulations may be generated based on one driving log. A single driving simulation may be generated based on one driving log. A plurality of driving simulations may be generated based on a corresponding plurality of driving logs.

A distribution for a characteristic of at least one simulated object may be determined based on the driving simulations. The distributions may be based on a plurality of simulated values for the characteristic. The distribution for the characteristic may be determined for a single simulated object, wherein the distribution indicates the variation in the characteristic over the driving simulation. For example, a plurality of sample points may be determined over which the characteristic is sampled. The distribution may be determined for a plurality of simulated objects within a single driving simulation. The distribution may be determined for a plurality of simulated objects in a plurality of driving simulation.

The distribution for the characteristic for the simulated object(s) (i.e. the 'simulated' distribution) may be compared to a distribution for the characteristic of one or more real-world objects from the one or more driving logs (i.e. a 'real' distribution). A comparison of the simulated and real distributions may indicate how realistic the simulated distribution is and/or an error between the two distributions. This may be referred to as a metric, which can be subsequently used to improve, evaluate, or validate an object model according to which the simulated object(s) were controlled. As with the simulated distribution, the real distribution may comprise a corresponding distribution formed based on one real-world object in a single driving log, a plurality of real-world objects in a single driving log, or a plurality of real-world objects in a plurality of driving logs.

A driving log may comprise data gathered by a real-world vehicle, which may be an autonomous vehicle, travelling through a real-world environment. The real-world vehicle may gather data from one or more sensors and may generate a driving log comprising the data gathered from the sensors. In some examples, data may also be generated, either at the real-world vehicle or remotely, based on the sensor data, such as by a localization, perception, planning, or prediction component. The driving log may comprise any combination of data gathered from sensors of a real-world vehicle driving in a real-world environment and data generated based on that data, either locally, at the vehicle, or remotely. In some examples, a driving log may comprise data gathered by one or more static cameras or sensors, one or more unmanned aerial vehicles (UAV), or by other means.

A driving log or a portion of a driving log may be used to generate a driving simulation. A portion of a driving log may comprise a vehicle trip (e.g., cycle from start to stop) or a portion of vehicle trip. In some examples, the portion of the driving log may represent a period of time (e.g., 20 seconds, 30 seconds, 45 seconds, etc.) that is less than a total time associated with the log. For example, a driving simulation may include a 30 second period of time (e.g., snippet) of a 40-minute log associated with a vehicle operating in a physical environment, though this is just an example and other periods of time associated with the driving simulation and/or driving log are contemplated herein.

In the driving simulation, a simulated vehicle and one or more simulated objects may be controlled. The simulated vehicle and/or the one or more simulated objects may comprise playback agents that are controlled according to the driving log and do not deviate or have independent decision-making control in the simulation. One or more of the simulated objects may be replaced with a smart agent that shares some of the same features as its corresponding object in the driving log but is able to make decisions independently in relation to some characteristics. For example, the smart agent may be configured to travel between a starting point and a destination that are shared with its corresponding object in the driving log but may be controlled by an object controller independently of the driving log between those points, such that the object controller controls at least one characteristic according to an object behavior model. Playback agents in simulations may be replaced by smart agents utilizing techniques such as those described in U.S. patent application Ser. No. 17/184,128 which is incorporated herein by reference for all purposes, for example. Once the simulation is performed, with at least one smart agent, at least one simulated value for at least one characteristic may be determined from the simulation. The at least one simulated value may be determined based on simulated sensor data and/or output perception data from the simulation. In other examples, the at least one simulated value may be output from a simulated component such as a simulated perception component of a simulated vehicle in the simulation. The at least one simulated value may be combined with other simulated values for the characteristic, determined from the same simulation and/or other driving simulations, to form a simulated distribution.

Having determined a simulated distribution based on the simulation(s), corresponding real values may be determined for the characteristic, the values being associated with one or more real-world objects corresponding to or operating under similar conditions (or operational design domains (ODDs) of the autonomous vehicle) to the smart agent based on one or more driving logs. The simulations may be based on one or more driving logs, and at least a subset of these driving logs may be used to determine values for the characteristic to determine a real distribution. The driving logs may be converted to playback simulations, in which all agents act according to the driving log, and the distributions may be determined based on these playback simulations. the driving simulations provide example distribution of how an object model controls one or more smart agents in a simulation, while the driving logs provide an example distribution of how one or more real-world object corresponding to the smart agents behaved in a corresponding real-world situation. Accordingly, the distributions determined from each of the simulation and the driving log are comparable. A metric may be determined based on these distributions to enable comparison.

The characteristic for which the distributions are determined may relate to speed of one or more agents. The speed may comprise a speed profile, a maximum speed, an average overall speed, an average difference between speed and the speed limit, and/or a categorization of the agent's behavior based on their speed.

The characteristic for which distributions are determined may relate to an acceleration of one or more agents. The acceleration may comprise an acceleration profile, a maximum acceleration, an average acceleration, or a categorization of behavior based on acceleration.

The characteristic may relate to a distance between the one or more agents and one or more other objects. For example, the distance may comprise a following distance between the agent and a vehicle in front of it. The vehicle in front may comprise the autonomous vehicle. The following distance may comprise an average following distance, a minimum following distance, or a maximum following distance. The distance may comprise a stopped separation distance. The stopped separation distance is the distance between the agent and a vehicle in front of it when both vehicles stop at, for example, a traffic light or stop sign. The stopped separation distance may comprise an average stopped separation distance, a maximum stopped separation distance, or a minimum stopped separation distance. The characteristic may comprise a speed with which a maneuver is performed, such as a turning speed, or a time taken to complete a maneuver.

In some examples, the characteristic may comprise a trajectory. As will be described in more detail below, a plurality of trajectories may be determined from the driving logs and a distribution determined based on these trajectories. The distribution of trajectories may be compared with a distribution generated based on a plurality of predicted trajectories generated by providing data from one or more simulations to a prediction component.

The distributions may comprise histograms. A metric may be determined based on one or more values derived from the distributions. The metric may be based on an earth movers distance between the distributions. The metric may be based on a mean value of each distribution. The metric may be based on a median value of each distribution. The metric may be based on a range of each distribution. The metric may be based on a shape of each distribution. The metric may be based on a standard deviation of each distribution. A difference between the mean, median, range, or standard deviation may be determined for the distributions and the metric may be based on the difference.

The metric may comprise or be based on a difference between respective values derived from a simulated distribution and a real distribution. The metric may also or alternatively comprise an error value between the values. The metric may be compared to one or more thresholds to determine if there is a significant deviation between the values. The metric may be a behavior metric. The value of the metric may indicate how realistic the object model is considered to be. The metric may be determined based on a plurality of simulated and real distributions, wherein each distribution relates to a different characteristic. The metric may relate to a plurality of different characteristics and may therefore indicate how realistic the object behavior model is as a whole.

In some examples, where driving logs are used to generate simulations, particular aspects of the driving logs may be chosen to target particular characteristics of the object behavior model. For example, driving logs from a particular time of day may be chosen. Driving logs may be analyzed to determine behavioral characteristics of the agents therein and therefore to categorize or identify correlations between particular characteristics. For example, driving logs comprising data gathered at night time may include agents that are more aggressive in their driving style than agents found in daytime driving logs. Accordingly, an object behavior model may be tailored for simulating night time driving by using night time data to improve its realism. These may be referred to a conditions or operational design domains (ODD), i.e. characteristics of the environment, time, scenario in which the real driving was performed. Particular conditions may be determined based on real driving logs. Models may be modified for particular conditions, such that a model is applied only when the particular condition is identified in a simulation or driving log. In some examples, models may be determined that are specific to a particular condition or ODD.

The object model may be modified based on at least one metric derived using the above techniques. An object model may be implemented as one or more machine learning (ML) models. In some examples, an ML model may comprise a neural network. An exemplary neural network is an algorithm which passes input data through a series of connected layers to produce an output. Each layer in a neural network can also comprise another neural network, or can comprise any number of layers (whether convolutional or not). As can be understood in the context of this disclosure, a neural network can utilize machine-learning, which can refer to a broad class of such algorithms in which an output is generated based on learned parameters. Any type of machine-learning can be used consistent with this disclosure. Improvements to ML models may involve training the model using the determined metrics.

The modified object model may subsequently be applied in further simulations. The further simulations may form part of the process being re-performed to determine improvements in the object model. For example, a further simulation may be performed based on the same or similar driving scenarios and driving simulations, and the smart agents may be controlled by the object controller according to the modified object model. The smart agents being controlled may be the same smart agents as were controlled in the original driving simulation(s). A further simulated distribution may be determined. The further simulated distribution may be compared with the real distribution to determine a new value for the metric. The new value may be compared to the previous value to determine if the modified object model is improved relative to the previous object model (i.e. the new value is less, or indicates that the further simulated distribution is more realistic). In some examples, the two simulated distributions may be compared to determine the changes to the distributions caused by the modifications to the object model.

In some examples, the modified object model may be applied to simulations that are used for testing one or more hardware or software components of an autonomous vehicle. For example, the modified object model may be used to generate test data for an autonomous vehicle's reaction to a particular scenario. Because the modified object model may be modified to improve the realism of the behavior of a plurality of different smart agents, realistic driving simulations in which a portion or all of the agents are controlled by the object controller may be generated. In other words, by improving the object model, driving simulations that do not correspond to a driving log may be generated that are realistic. Improvements to the one or more hardware or software components may be determined and implemented based on the simulation using the modified object model.

As described above, in some examples, a distribution determined from a plurality of real trajectories may be compared with a distribution of predicted trajectories determined by a prediction component based on one or more simulations. In these examples, the prediction component may be a prediction component from an autonomous vehicle. Using the prediction component to generate predicted trajectories and comparing these with real trajectories enables a realism of an object model to be tested. In other examples, the actual trajectories may be directly compared with predicted trajectories determined from simulations.

In other examples, a plurality of trajectories may be determined in simulation. These simulated trajectories may also be used to determine a distribution and may be compared with predicted trajectories determined based on the same simulations. In some examples, one or more simulated trajectories may be directly compared with one or more predicted trajectories for a corresponding agent. In these examples, where simulated and predicted trajectories are compared, the prediction component is used effectively as a ground truth. The prediction component may be the prediction component used by a road-going real autonomous vehicle or may be an enhanced version of the prediction component used by a real autonomous vehicle, meaning that its output has been sufficiently validated relative to real-world data such that the predicted trajectories it outputs are considered to represent realistic outcomes or a distribution of realistic outcomes. The prediction component can therefore be used as a pseudo-indicator of realism for a simulated agent. Of note, the simulated agent (even a smart agent) may be assigned relatively few compute resources and may therefore operate with limited intelligence to allow the control of such agents to scale across multiple simulated agents. Using a prediction component to provide a ground truth avoids requiring many different driving logs, and instead enables simulation realism to be improved using computer-implemented methods alone. Many of the techniques described herein in relation to a comparison of real and simulated characteristics through distributions may also be applied to techniques that compare trajectories of simulated components with predicted trajectories.

A prediction component may be configured to receive, as input, data in a predetermined format, the format being a format used to communicate data within a real autonomous vehicle. The format may comprise a message format for communicating between components of the real autonomous vehicle. Simulation data may be configured to be provided in the predetermined format to allow the prediction component to determine the predicted trajectory as it would for a real component. The data may be provided from a simulated perception component that imitates the actions of a real perception component of a real autonomous vehicle. In other examples, the prediction component may be configured as an offline component that takes as input an entire driving log for an entire journey and determines predicted trajectories for objects at a plurality of times during the journey captured by the driving log.

A trajectory may comprise a position of an agent at a particular time. A trajectory may comprise an orientation of an agent at a particular time. The particular time may be defined by a timestamp associated with the position and/or orientation. When the trajectories are relative to a simulation, the time may be a point in time relative to the simulation. The simulation may include timestamps. Each timestamp may be associated with a frame of the simulation. The times in the simulation may correspond to points in time in a real scenario.

When comparing predicted and simulated trajectories, the metric may be based on a difference in the position of the smart agent at a corresponding time in both the simulated trajectory and the predicted trajectory. This may be the time to which the prediction has been made or a position between a starting position of the agent and the final position of the agent. The metric may be based on an average difference in position. For example, a plurality of sample positions along each trajectory may be determined for each of a plurality of points in time and a distance between corresponding sample positions may be determined. An average, i.e. a mean, a median, a range, or another average measure, may be determined for these distances. The metric may be based on a difference in orientation of the agent at a particular time along the trajectories. The metric may be based on a difference in shape between the two trajectories. The metric may be based on a difference in length between the two trajectories.

In some examples, a prediction component may determine a plurality of predicted trajectories for the agent. The plurality of predicted trajectories may be compared with the simulated trajectory actually taken by the agent. A predicted trajectory that best fits the simulated trajectory may be determined. The prediction component may also determine a probability value associated with each predicted trajectory. The metric may therefore be based on a probability value associated with the predicted trajectory that best fits, i.e. is most similar to, the simulated trajectory. In some examples, a probability value for the simulated trajectory may be determined based on one or more similar predicted trajectories and their associated probability values. If it is determined that the simulated trajectory corresponds to a predicted trajectory that has a probability value that is lower than a threshold probability value, or does not correspond to a predicted trajectory that does not have the highest probability value, then it may be determined that the object behavior model is not sufficiently realistic. The object behavior model may be modified accordingly to improve its realism.

In some examples, a prediction component may determine a plurality of predicted trajectories for the agent and the driving simulation involving the agent may be run a plurality of times to generate a plurality of simulated trajectories. In other examples, a prediction component may determine a plurality of predicted trajectories for a plurality of different agents within a single simulation or within a plurality of simulations. It may be determined whether a variation in predicted trajectories matches a variation in simulated trajectories. As described above, a distribution for each of the plurality of predicted trajectories and the plurality of simulated trajectories may be determined. The distributions may be compared to enable a difference therebetween to be determined. A metric may be based on the distributions. The metric may subsequently be used to improve the object behavior model. The metric may comprise or be based on an earth movers distance between the two distributions, a in a mean value of the two distributions, a range of the two distributions, a standard deviation of the two distributions, or a median value of the two distributions. Where the metric is based on a mean, range, standard deviation, or a median value, the metric may be based on a difference between these values.

Improving the object behavior model may include classifying the simulated object according to its behavior. The behavior may be selected as a behavior type from several behavioral types or personalities. Each of the behavioral types or personalities may correspond to a respective different behavioral model. By classifying the simulated object, the appropriate behavioral model may be improved based on the metric.

Figure 2:
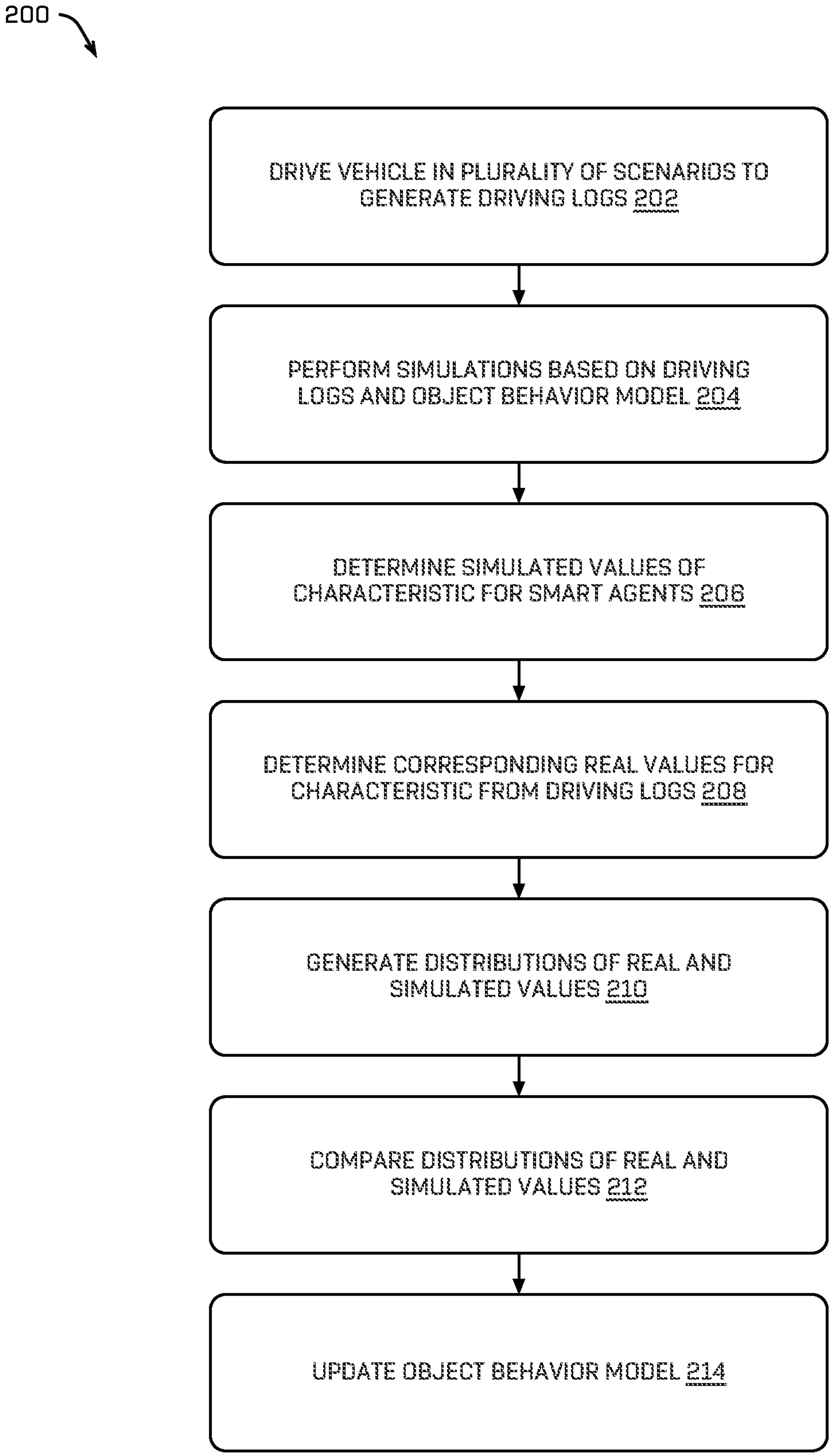
FIG. 2 depicts a flow chart of the process for improving smart agent behavior in simulations based on driving log data according to embodiments of the present invention.

FIGS. 1 and 2 illustrate a first embodiment of the invention. In FIG. 1, a real driving situation 100A is shown. A first vehicle 102A, which in this example is an autonomous vehicle, is depicted as travelling on a road 104A. A second vehicle 106A, which in this example is a human-operated car, may also be travelling on the road 104A. A pedestrian 108A may be walking along a sidewalk 110A adjacent the road 104A. The first vehicle 102A may comprise one or more sensors 112. The sensors 112 may gather sensor data relating to the real driving situation 100A, and particularly in relation to the environment in which the first vehicle 102A is travelling, the second vehicle 106A, and the pedestrian 108A. The first vehicle 102A may include one or more sensors that monitor its own operation. If other vehicles, pedestrians, or objects, such as street furniture, street markings, and static vehicles, were present in the vicinity of the vehicle, the sensors 112 may gather data in relation to these features. Although only depicted in FIG. 1 as gathering data in front of the first vehicle 102A, the plurality of sensors 112 may be mounted on the first vehicle 102A to gather data relative to any part of the first vehicle 102A. For example, in some examples, autonomous vehicles may be configured such that their sensors gather data from all angles around the vehicle.

The first vehicle 102A is represented in the real-world situation 100A, while example vehicle systems are shown in a call-out box, numbered 114. The specific systems shown within vehicle systems 114 in FIG. 1 are provided for the purpose of explaining FIG. 1 and may form only a part of a wider vehicle system. The first vehicle 102A may comprise any systems appropriate to enable its autonomous or semi-autonomous control. An example of a vehicle such as the first vehicle 102A is described below in relation to FIG. 5.

The sensors 112 may form part of the vehicle systems 114 and may be configured to output sensor data 116. In some instances, the sensor 112 may include lidar sensors, radar sensors, ultrasonic transducers, sonar sensors, location sensors (e.g., global positioning system (GPS), compass, etc.), inertial sensors (e.g., inertial measurement units (IMUs), accelerometers, magnetometers, gyroscopes, etc.), image sensors (e.g., red-green-blue (RGB), infrared (IR), intensity, depth, time of flight cameras, etc.), microphones, wheel encoders, environment sensors (e.g., thermometer, hygrometer, light sensors, pressure sensors, etc.), etc. The sensors 112 may include multiple instances of each of these or other types of sensors. For instance, the radar sensors may include individual radar sensors located at the corners, front, back, sides, and/or top of the vehicle 102A. As another example, the cameras may include multiple cameras disposed at various locations about the exterior and/or interior of the vehicle 102A. The sensors are also described below in relation to FIG. 5.

A perception component 116 may also form part of the vehicle systems 114. The perception component 116 may be configured to detect object(s) in in an environment surrounding the vehicle 102A (e.g., identify that an object exists), classify the object(s) (e.g., determine an object type associated with a detected object), segment sensor data and/or other representations of the environment (e.g., identify a portion of the sensor data and/or representation of the environment as being associated with a detected object and/or an object type), determine characteristics associated with an object (e.g., a track identifying current, predicted, and/or previous position, heading, velocity, and/or acceleration associated with an object), and/or the like, and may output perception data associated with the same.

A prediction component 120 may also form part of the vehicle systems 114. The prediction component 120 may be configured to generate predicted trajectories of objects in an environment. For example, the prediction component may generate one or more predicted trajectories for objects within a threshold distance from the vehicle. In some examples, the prediction component may measure a trace of an object and generate a trajectory for the object based on observed and predicted behavior. Prediction components may be configured to generate one or more probability maps representing prediction probabilities of possible locations of one or more objects in an environment. For example, the prediction component may generate one or more probability maps for vehicles, pedestrians, animals, and the like within a threshold distance from the vehicle. In some examples, the prediction component may measure a track of an object and generate a discretized prediction probability map, a heat map, a probability distribution, a discretized probability distribution, and/or a trajectory for the object based on observed and predicted behavior.

Data output from the sensors 112, the perception component 116 and the prediction component 120 may be stored as part of a driving log in a driving log database 118. The driving log database 118 may be stored in memory (not shown) of the vehicle 102A. The driving log database 118 may comprise a plurality of driving logs generated by the vehicle 102A. The data output from the sensors 112, the perception component 116, and/or the prediction component 118 may also be provided to other components of the vehicle systems 114 that use the data to determine further data. For example, a localization component may generate localization data based on the data, or a planning component may generate planning data based on the data. The vehicle computing device may be configured to store the further data in the driving log database 118 as part of a driving log. The further data may be associated with the data in the driving log on which it is based. This may be achieved by using a timestamp.

In the example of FIG. 1, driving log data 122A may be provided to a remote computing device(s) 122 for the purpose of improving simulation realism. While shown in FIG. 1 as being sent directly from the driving log database 118A, the driving log data 122A may be provided to the remote computing device(s) 122 in any suitable way. In examples, the driving log data 122A for a journey may be provided as a packet of data sent from the driving log database 118 once the vehicle 102A has completed the journey (i.e. stopped at a predetermined location or stopped for a predetermined amount of time). In other examples, driving log data from multiple different journeys may be sent to the remote computing device(s) 150 at a convenient time. For example, a vehicle may send the data to the remote computing device(s) 150 periodically, such as at a predetermined time each day or each week. In other examples, the vehicle may stream the data to the remote computing device(s) 150 in real time, which may compile and store the data in memory. In some examples, the remote computing device(s) 150 may be configured to query the vehicle 102A or another computing device at which driving log data 120A is stored to retrieve the data.

The remote computing device(s) 150 may include a simulator 124. The simulator 124 may be configured to perform driving simulations in which simulated driving scenarios are performed and data comprising simulated values for one or more behavioral characteristics of simulated objects gathered. Simulation of driving scenarios may be a useful way to implement testing and validation of components and/or to generate test and learning data for models and algorithms, such as neural networks or other machine learning algorithms. In the example of FIG. 1, the simulator 124 may be configured to generate driving simulations 126 that are based on the driving log data 122A but that have at least one or more agents that are controlled according to an object behavior model.

As shown in FIG. 1, the simulator 124 may be configured to receive driving log data 122A and may be configured to generate, based on the received data, a simulation 126 based on the received data. At least one simulation 126 may be generated based on driving log data from a single driving log. In some examples, a plurality of simulations 126 may be generated based on a single driving log. Each simulation 126 may have a predetermined length or include data relating to a particular object or object type.

Accordingly, in the example of FIG. 1, the simulator 124 may be configured to generate a driving simulation 126, which may include a simulated driving situation 100B that corresponds to the real driving situation 100A. Herein, use of the letters A and B after reference numerals refer to corresponding real and simulated features. The simulated driving situation 100B may include a simulated first vehicle 102B and a simulated second vehicle 106B travelling on a simulated road 104B, and a simulated pedestrian 108B on a simulated sidewalk 110B. The simulated first and second vehicles 102B, 106B may correspond to the real first and second vehicles 102A, 106A. The simulated pedestrian 108B may correspond to the real pedestrian 108A. The simulated road 104B and simulated sidewalk 110B may correspond to the real road 104A and the real sidewalk 110A respectively.

In the driving simulation 126 of FIG. 1, the simulator 124 may control the simulated first vehicle 102B according to the driving log data 122A. In other words, the simulated first vehicle 102B may be controlled as a playback vehicle by a playback controller 128. The simulated first vehicle 102B may operate in the manner described by the driving log data received from the real first vehicle 102A without deviation.

In contrast, the simulator 124 may control the simulated second vehicle 106B and the simulated pedestrian 108B according to an object behavior model 130 using an object controller 132. The object behavior model 130 may comprise a machine learning model. The machine learning model may comprise a neural network. Accordingly, the simulated second vehicle 106B and the simulated pedestrian 108B may be smart agents, and may be configured to act independently of at least some of the driving log data 120A.

In the simulation 126, the simulator 124 may determine a simulation of the environment and/or the vehicle 102A based on the sensor data, the perception data and/or any other data it receives in a driving log. For example, the simulation may comprise a representation of a position, orientation, movement, and/or quality of portions of the environment and/or the first vehicle 102A, second vehicle 106A, pedestrian 108A, and/or any other object in the environment. The environment may comprise vegetation, a building, signage, and/or the like.

The driving simulation 126 is shown as a three-dimensional simulation in the image shown for the simulated driving situation 100B. In the example of FIG. 1, the three-dimensional simulation is considered to include occlusion data based on positional and dimensional data associated with one or more objects. Occlusion data indicates where an object or area of the environment surrounding the first vehicle 102A may be occluded from the view of one or more sensors. An area of the environment may be occluded from view of one or more sensors due to a static object or dynamic object being positioned between vehicle and the area of the environment, such that the object blocks the area from the sensor. The object may effectively cast a shadow over an area of the environment that is not visible to the sensors and that changes based on the relative positions of the sensors and the occluding object.

In other examples, the driving simulation may be a three-dimensional simulation that does not include occlusion data. A three-dimensional simulation may comprise position, orientation, geometric data (e.g., a polygon representation, a digital wire mesh representation) and/or movement data associated with one or more objects of the environment and/or may include material, lighting, and/or lighting data, although in other examples this data may be left out.

In other examples, the driving simulation may be a two-dimensional simulation. In some examples, the driving simulation may include objects but may exclude the vehicle and its sensors. In other words, the vehicle and its sensors may not be modelled by the driving simulation and instead may output data relating to the actions of objects directly without reference to a sensor. In some examples, the playback driving simulation may include a vehicle but may not model one or more sensors. Alternatively, or additionally, one or more different sensors may be modelled on the vehicle in order to reduce the computational resources required to perform the driving simulation.

The driving simulation 126 may be configured to output simulated driving log data 122B. The simulated driving log data 122B may comprise one or more simulated values for one or more predetermined characteristics. The simulated values and characteristics may be associated with the object behavior model, and may relate to one or more of the smart agents, such as the simulated second vehicle 106B or the simulated pedestrian 108B.

The simulated values in the simulated driving log data 122B may be determined for a plurality of different times within a driving simulation, a plurality of different smart agents within a driving simulation, or a plurality of different driving simulations. A plurality of simulated values for a particular characteristic may be combined to determine a distribution 134B of simulated values for the characteristic.

Similarly, corresponding values in the real driving log data 122A may be determined for a plurality of different times in one or more driving logs, a plurality of different objects in one or more driving logs, or a plurality of different driving logs. A plurality of real values for a particular characteristic may be combined to determine a distribution 134A of real values for the characteristic.

The distributions and/or the plurality of values may be provided to a processor 138. The processor may be configured to compare the distributions and/or the corresponding values to determine one or more metrics. For example, the distributions may comprise histograms. The processor may be configured to determine an earth movers distance between the distributions. The processor may be configured to determine a mean value, a median value, a range, or a standard deviation of each distribution. A metric may comprise the earth movers distance, mean, median, range, or standard deviation, or may be based on one or more of these values. Based on the distributions, the processor 138 may be configured to determine an updated object behavior model 140.

In a particular example, the first vehicle 102A may be driven around a real environment to generate a plurality driving logs. The driving logs may be provided to the simulator 124 to generate a plurality of driving simulations, including driving simulation 126, thereby generating simulated driving logs. The real and simulated driving logs may comprise data relating to acceleration profiles of a plurality of vehicles and a plurality of smart agents representing the vehicles respectively. Distributions of one or more values representing the acceleration profiles may be determined. Differences between the distributions or between acceleration profiles may be determined to identify an error in the realism of the object behavior model and used to update the object behavior model. Accordingly, the values may themselves be metrics determined based on data.

Although not described in relation to FIG. 1, in some examples, an object model, such as an object distribution model or the object behavior model 130 may be configured to determine placement or distribution of one or more static objects within the simulated environment 100B. The process described in relation to FIG. 1 may also be implemented for determining distributions of static objects and updating an object model based on the determined distributions. For example, a distribution may comprise a frequency of static objects within the real-world scenario 100A and the driving simulation 100B. Alternatively, a distribution may relate to distance between, positions of, angles, distance from curb, etc of static objects.

The process of FIG. 1 may be summarized as flow chart, such as the flow chart 200 of FIG. 2. The method 200 may be performed at one or more computing devices, such as computing device 122.

The method 200 may comprise, at a first step 202, driving a vehicle (or a plurality of vehicles), such as first vehicle 102A, in a plurality of driving scenarios, such as scenario 100A, to generate a plurality of driving logs. The plurality of driving logs may be provided to and received by a computing device such as computing device 150. In some examples, the vehicle may be driven only in one driving scenario, meaning that one driving log is generated.

At step 204, a plurality of simulations, such as driving simulation 126, may be performed based on the plurality of driving logs and an object behavior model, such as model 130. In the driving simulation, which is based at least in part on the driving log or logs, a simulated object that corresponds to a real-world object may be controlled by an object controller according to the behavior model.

At step 206, a plurality of simulated values may be determined for a characteristic of one or more smart agents, such as simulated second vehicle 106B, representing real objects in the driving logs. The simulated values may be determined based on a single driving simulation. Where a single driving simulation is used, the simulated values may be determined for a single agent or a plurality of agents within the simulation. A plurality of driving simulations may be used and a plurality of simulated values determined based on the plurality of driving simulations.

A corresponding plurality of real values may be determined for the characteristics for the real object(s) from the driving log(s) at step 208. The real values may be determined from the driving log(s) used to generate the driving simulation(s). One driving log may be used to generate a plurality of driving simulations. A plurality of driving logs may be used to generate a plurality of driving simulations. The plurality of real values may be determined from driving logs that correspond to the driving simulations and for corresponding agents or objects in the driving logs that correspond to the simulated objects for which the value for the characteristic is determined. In some examples, the real values may be determined for agents and driving logs that have similar conditions or operational design domains to enable a comparison to be drawn.

At step 210, distributions, such as distributions 134A and 134B, may be determined based on the values determined at steps 208 and 206 respectively. The distributions may comprise a histogram.

The distributions may be compared to determine a metric at step 212 and the metric or comparison may be used to generate an update an object behavior model, such as model 140, at step 214.

In the examples of FIG. 1 and FIG. 2, the characteristics may relate to velocity of an object and its corresponding smart agent (e.g. average speed, top speed, exceedances of a speed limit, how much under or over a speed limit the actual speed is, a speed profile, a speed approaching junctions), acceleration of an object and its corresponding smart agent (e.g. average acceleration, maximum acceleration, acceleration profile, which may depend on speed limits, road type, or other environmental factors), following distance between the object or agent and a vehicle that it is following, stopped separation distance between the object or agent and a vehicle that it is following, turning speed, and time to clear an intersection or to perform a maneuver.

Figure 3:
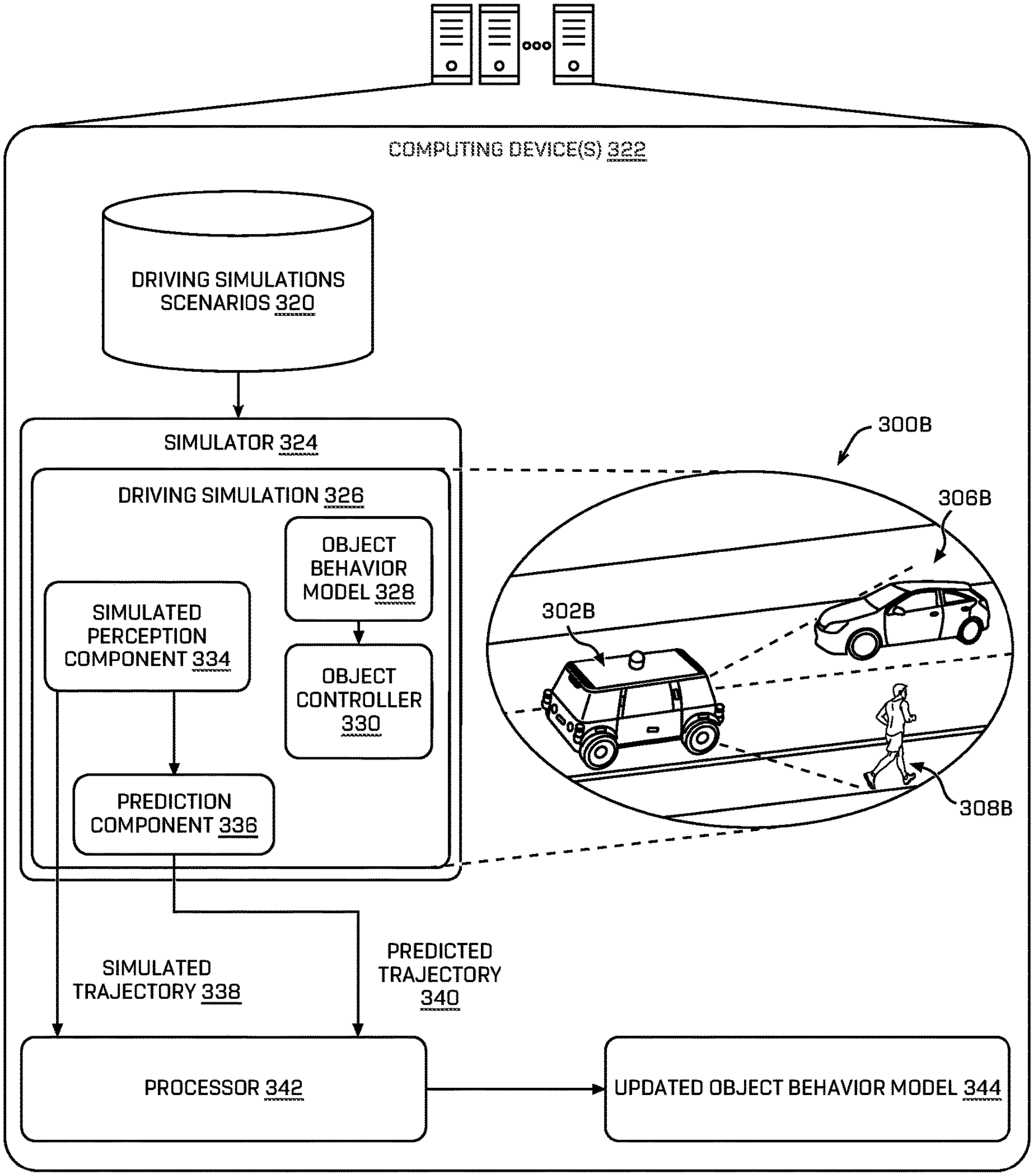
FIG. 3 is a pictorial diagram of a process for improving smart agent behavior in simulations based on prediction data according to embodiments of the present invention.
Figure 4:
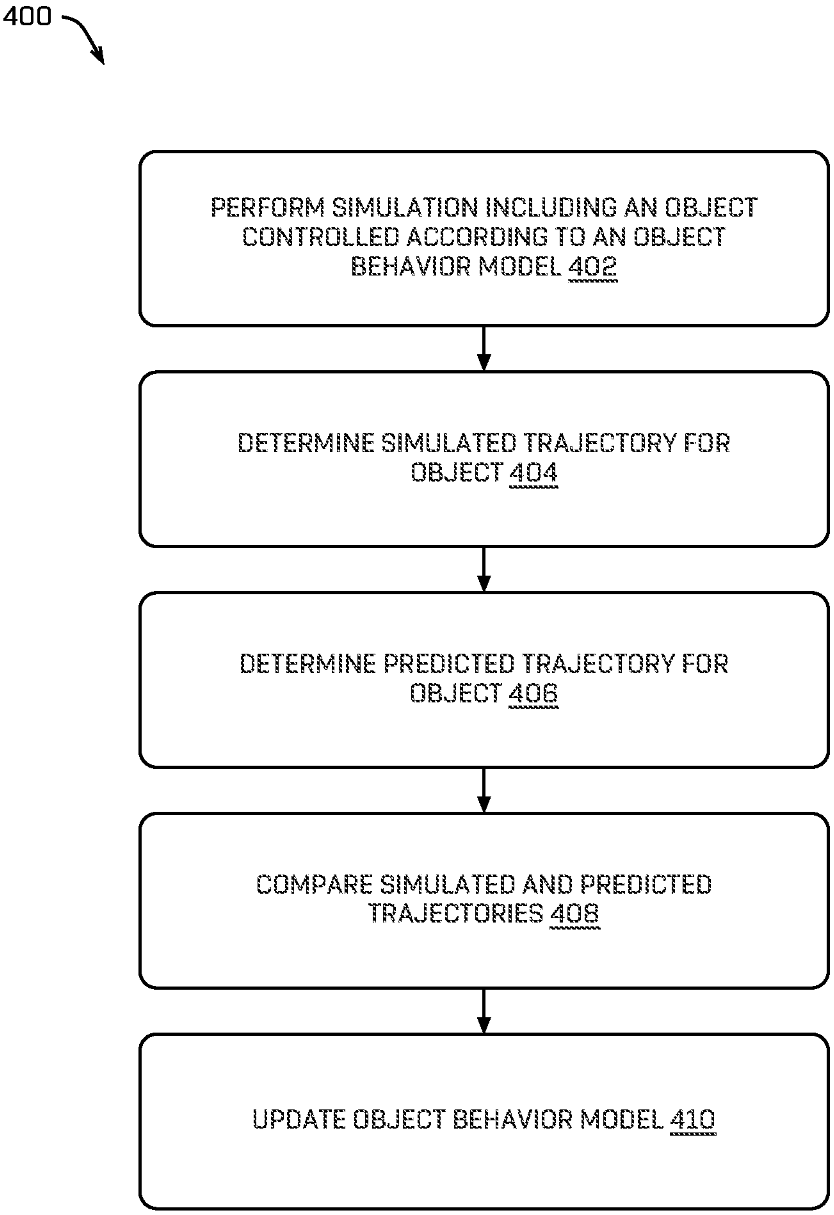
FIG. 4 depicts a flow chart of the process for improving smart agent behavior in simulations based on prediction data according to embodiments of the present invention.

FIGS. 3 and 4 illustrate a second embodiment of the invention. In FIG. 3, in contrast to FIG. 1, only a computing device 322 is shown. The methods described in relation to FIGS. 3 and 4 may be performed within one or more computing devices, such as computing device 322. Alternatively, the methods of FIGS. 3 and 4 may make use of driving logs generated at one or more real vehicles, as described in relation to FIG. 1.

The computing device 322 may comprise memory (not shown) storing a plurality of driving simulation scenarios 320. The plurality of driving simulation scenarios 320 may comprise predetermined simulated environments and agents. The agents may be set as playback agents according to a driving log on which the simulation is based or may be set as smart agents that are to be controlled according to an object behavior model 328 by an object controller 330. Accordingly, agents in the driving simulation scenarios enable a wide variety of different simulations and conditions to be simulated for each scenario. The driving simulation scenarios 320 may be generated based on driving log data received from one or more real vehicles, such as vehicle 102A.

One or more driving simulation scenarios may be provided to a simulator 324. The simulator may be configured to generate a driving simulation 326 based on a scenario, by, as described above, selecting agents to be playback agents or smart agents. The simulator 324 may set one or more other parameters or may define particular characteristics for each of the smart agents. For example, the simulator 324 may be configured to specify one or more behaviors or behavior profiles for a smart agent.

For example, in the simulated driving situation 300B shown in FIG. 3, as in FIG. 1, each of a simulated second vehicle 306B and a simulated pedestrian 308B may be smart agents and may be controlled according to an object behavior model by an object controller 330. The simulated first vehicle 302B may be controlled by a playback controller.

The simulator 324 may be configured to control the smart agents to take trajectories determined by the object controller according to the object behavior model 328.

A simulated perception component 334 may be configured to determine perception data, such as one or more states of the simulation at corresponding points in time, based on the driving simulation 326. The simulated perception component 334 may be configured to imitate the operation of a real perception component provided on a real autonomous vehicle and to output simulated perception data indicating what a real perception component would determine if it were operating on the simulated vehicle 302B. The simulated perception component 334 is configured to determine the same output as a real perception component but based on data from the simulation rather than actual sensor data. The simulated perception data may be provided by the simulated perception component 334, along with any other output data from the driving simulation 326 (which may be data output from the object controller 330 relating to its control of the smart agents), to a prediction component 336. The simulated perception data may be formatted in the same way as real perception data would be, so that it can be provided to the prediction component 336.

The prediction component 336 may be a prediction component of a real vehicle or that is configured to operate in the same way as a prediction component of a real vehicle, using the same input data or format of input data and generating the same output. In some examples, the prediction component 336 may be an enhanced version of a prediction component used by a real vehicle, but may still take the same input format and provide the same outputs. For example, a real prediction component may be configured to predict events that have not yet happened based on data at the current moment in time. An enhanced prediction component may be configured to use data determined for a whole journey and determine predictions for points along the journey. The prediction component of an autonomous vehicle may be configured to output predicted route(s) for a corresponding object to a high degree of certainty to support autonomous driving operations. Therefore, the output of such a prediction component can provide a good basis of comparison for simulated components which may not be as complex or may be verified to different or less stringent requirements. Examples or prediction component are included in U.S. Pat. No. 10,671,076, entitled "TRAJECTORY PREDICTION OF THIRD-PARTY OBJECTS USING TEMPORAL LOGIC AND TREE SEARCH," and U.S. Pat. No. 11,195,418, entitled "TRAJECTORY PREDICTION ON TOP-DOWN SCENES AND ASSOCIATED MODEL," which are each incorporated herein in their entirety and for all purposes. In some examples, a more robust tool can be used using information that may not be unavailable to a real autonomous vehicle prediction component (e.g., information regarding future states of objects) as disclosed in patent application Ser. No. 17/581,699 filed on Jan. 21, 2022, entitled "TOOL FOR OFFLINE PERCEPTION COMPONENT EVALUATION" which is hereby incorporated in its entirety for all purposes.

In some examples, real prediction data may be used by an autonomous or semi-autonomous vehicle as it traverses an environment. Such prediction data may be stored in a driving log (e.g., outputs of the prediction system may be stored which may comprise predicted trajectories for one or more objects). A simulation may be generated based on a driving log which may include outputs from a prediction component for the autonomous vehicle. As such, predicted trajectories may be pulled directly from the driving logs for use in comparison to a simulated trajectory, such as when the simulation begins to diverge from the driving log through the use of smart agents following a behavior model, for example. In some examples, perception data from simulation may be generated by a simulation component to emulate an output of real (autonomous vehicle) wherein such a component may not be necessary. For example, a simulated component may output data (e.g., bounding boxes, classifications, yaw values, velocities, etc.) that would normally be output by a perception component of the vehicle for a corresponding prediction component to ingest. When in simulation, such data may be generated based on position data or like information for a simulated agent rather than, for example, sensor return information that a real perception component may ingest. This may simplify the generation of perception data for use by a prediction component. In some examples, however, simulated sensor data may be provided to a real perception component for use in simulation.

The prediction component 336 may determine a predicted trajectory 340 for one or more of the smart agents controlled according to the object behavior model 328 based on the data it receives. A corresponding simulated trajectory 338 for the same smart agent(s) may be determined based on the data output from the simulated perception component 334 and/or from another component of the simulator 324 or driving simulation 326, that is output from the driving simulation 126.

The simulated trajectory 338 may also be determined from simulated perception data. The simulated trajectory may be determined from simulated perception data that is input to the prediction component and simulated perception from one or more later points in time.

In some examples, the simulated vehicle 302B may be modelled such that it includes one or more simulated sensors. The simulated sensors may be configured to determine simulated sensor data, which may be provide to the simulated perception component 334.

The pair of the simulated trajectory 338 and predicted trajectory 340 may be provided to a processor 342 for comparison. The processor 342 may determine a difference, an error, or another metric between the simulated and predicted trajectories, and use the determined metric to generate an updated object behavior model 344.

In some examples, a plurality of different simulated trajectories and predicted trajectories may be determined for a single agent, a plurality of agents within one simulation, or a plurality of agents across different simulations. In some examples, a plurality of predicted trajectories may be determined and compared with one simulated trajectory. For example, a predicted trajectory may have an associated probability. The associated probabilities of a plurality of predicted trajectories may be used to determine a probability value associated with the simulated trajectory, and this may be used as or used to determine the metric.

The process of FIG. 3 may be summarized as flow chart, such as the flow chart 400 of FIG. 4. The method 400 may be performed at one or more computing devices, such as computing device 122.

The method 400 may comprise, at a first step 402, performing a simulation, such as simulation 326, including an object, such as simulated second vehicle 306B, controlled according to an object behavior model, such as object behavior model 328. At step 404, a simulated trajectory for the object controlled by the object behavior model may be determined. As described in relation to FIG. 3, this trajectory may be output from a driving simulation. At step 406, a predicted trajectory may be determined for the object, which may be output from a prediction component. The simulated and predicted trajectories may be compared, as at step 408, to determine a metric. Based on the metric that results from the comparison at step 408, an updated object behavior model may be generated at step 410. The metric may comprise a difference between the trajectories or a portion of the trajectories, an error value, a probability associated with the simulated trajectory based on the predicted trajectory, or an aggregate or average value determined over several such iterations of steps 402 to 408.

Figure 5:
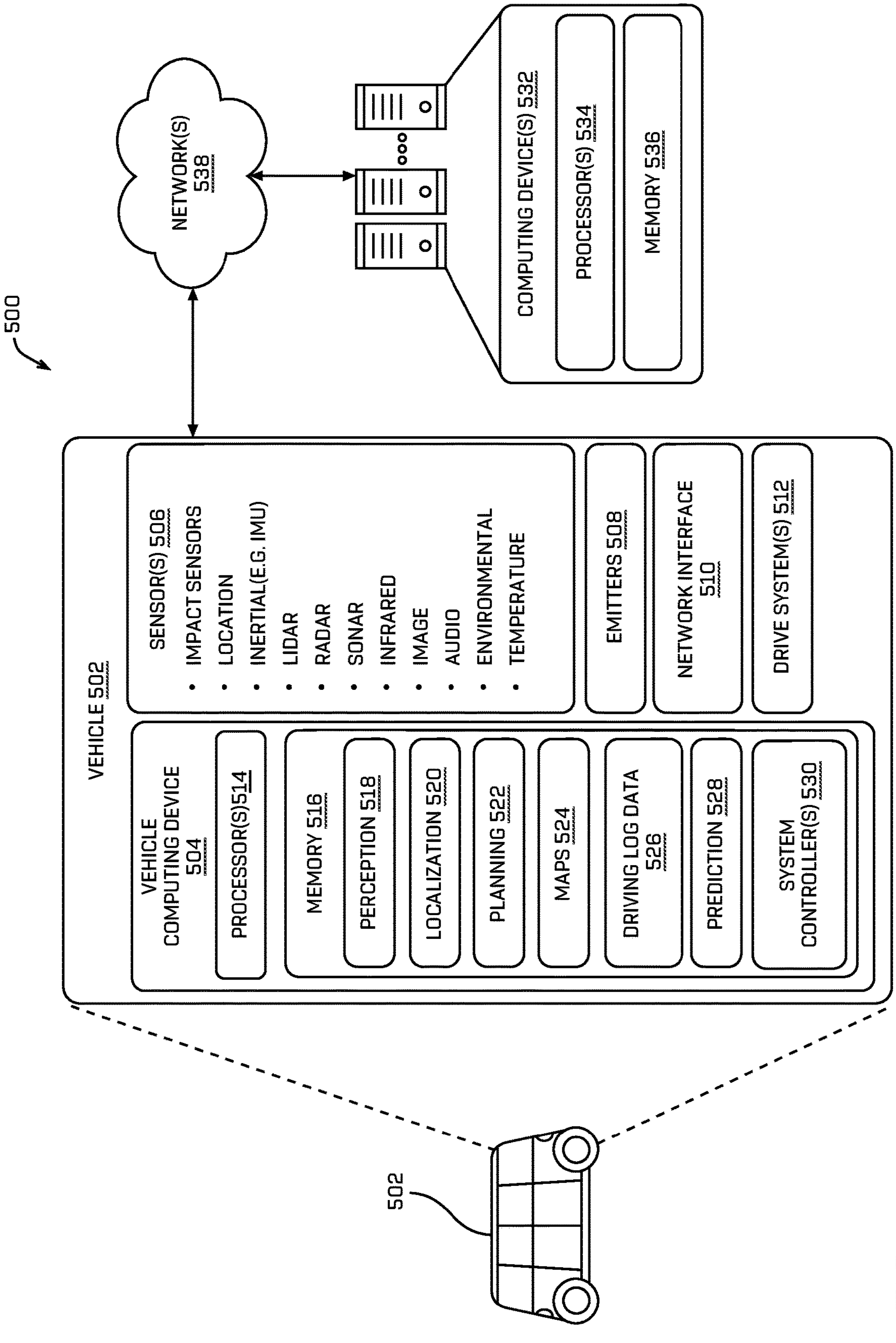
FIG. 5 is a block diagram of an example system for implementing the techniques described herein.

FIG. 5 illustrates a block diagram of an example system 500 that implements the techniques discussed herein. FIG. 5 may represent vehicle system 114A and computing device(s) 122 of FIG. 1. FIG. 5 may represent a vehicle system (not shown) and computing device 322 of FIG. 3. In some instances, the example system 500 may include a vehicle 502, which may represent the vehicle 102A in FIG. 1. In some instances, the vehicle 502 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the vehicle 502 may be a fully or partially autonomous vehicle having any other level or classification. Moreover, in some instances, the techniques described herein may be usable by non-autonomous vehicles as well.

The vehicle 502 may include a vehicle computing device(s) 504, sensor(s) 506, emitter(s) 508, network interface(s) 510, and/or drive system(s) 512. Sensor(s) 506 may represent sensor(s) 112. The system 500 may additionally or alternatively comprise computing device(s) 532.

In some instances, the sensor(s) 506 may represent sensor(s) 112 and may include lidar sensors, radar sensors, ultrasonic transducers, sonar sensors, location sensors (e.g., global positioning system (GPS), compass, etc.), inertial sensors (e.g., inertial measurement units (IMUs), accelerometers, magnetometers, gyroscopes, etc.), image sensors (e.g., red-green-blue (RGB), infrared (IR), intensity, depth, time of flight cameras, etc.), microphones, wheel encoders, environment sensors (e.g., thermometer, hygrometer, light sensors, pressure sensors, etc.), etc. The sensor(s) 506 may include multiple instances of each of these or other types of sensors. For instance, the radar sensors may include individual radar sensors located at the corners, front, back, sides, and/or top of the vehicle 502. As another example, the cameras may include multiple cameras disposed at various locations about the exterior and/or interior of the vehicle 502. The sensor(s) 506 may provide input to the vehicle computing device(s) 504 and/or to computing device(s) 532.

The vehicle 502 may also include emitter(s) 508 for emitting light and/or sound, as described above. The emitter(s) 508 may include interior audio and visual emitter(s) to communicate with passengers of the vehicle 502. Interior emitter(s) may include speakers, lights, signs, display screens, touch screens, haptic emitter(s) (e.g., vibration and/or force feedback), mechanical actuators (e.g., seatbelt tensioners, seat positioners, headrest positioners, etc.), and the like. The emitter(s) 508 may also include exterior emitter(s). Exterior emitter(s) may include lights to signal a direction of travel or other indicator of vehicle action (e.g., indicator lights, signs, light arrays, etc.), and one or more audio emitter(s) (e.g., speakers, speaker arrays, horns, etc.) to audibly communicate with pedestrians or other nearby vehicles, one or more of which comprising acoustic beam steering technology.

The vehicle 502 may also include network interface(s) 510 that enable communication between the vehicle 502 and one or more other local or remote computing device(s). The network interface(s) 510 may facilitate communication with other local computing device(s) on the vehicle 502 and/or the drive component(s) 512. The network interface(s) 510 may additionally or alternatively allow the vehicle to communicate with other nearby computing device(s) (e.g., other nearby vehicles, traffic signals, etc.). The network interface(s) 510 may additionally or alternatively enable the vehicle 502 to communicate with computing device(s) 532 over a network 538. In some examples, computing device(s) 532 may comprise one or more nodes of a distributed computing system (e.g., a cloud computing architecture).

The vehicle 502 may include one or more drive components 512. In some instances, the vehicle 502 may have a single drive component 512. In some instances, the drive component(s) 512 may include one or more sensors to detect conditions of the drive component(s) 512 and/or the surroundings of the vehicle 502. By way of example and not limitation, the sensor(s) of the drive component(s) 512 may include one or more wheel encoders (e.g., rotary encoders) to sense rotation of the wheels of the drive components, inertial sensors (e.g., inertial measurement units, accelerometers, gyroscopes, magnetometers, etc.) to measure orientation and acceleration of the drive component, cameras or other image sensors, ultrasonic sensors to acoustically detect objects in the surroundings of the drive component, lidar sensors, radar sensors, etc. Some sensors, such as the wheel encoders may be unique to the drive component(s) 512. In some cases, the sensor(s) on the drive component(s) 512 may overlap or supplement corresponding systems of the vehicle 502 (e.g., sensor(s) 506).

The drive component(s) 512 may include many of the vehicle systems, including a high voltage battery, a motor to propel the vehicle, an inverter to convert direct current from the battery into alternating current for use by other vehicle systems, a steering system including a steering motor and steering rack (which may be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive component(s) 512 may include a drive component controller which may receive and preprocess data from the sensor(s) and to control operation of the various vehicle systems. In some instances, the drive component controller may include one or more processors and memory communicatively coupled with the one or more processors. The memory may store one or more components to perform various functionalities of the drive component(s) 512. Furthermore, the drive component(s) 512 may also include one or more communication connection(s) that enable communication by the respective drive component with one or more other local or remote computing device(s).

The vehicle computing device(s) 504 may include processor(s) 514 and memory 516 communicatively coupled with the one or more processors 514. Computing device(s) 532 may also include processor(s) 534, and/or memory 536. The processor(s) 514 and/or 534 may be any suitable processor capable of executing instructions to process data and perform operations as described herein. By way of example and not limitation, the processor(s) 514 and/or 534 may comprise one or more central processing units (CPUs), graphics processing units (GPUs), integrated circuits (e.g., application-specific integrated circuits (ASICs)), gate arrays (e.g., field-programmable gate arrays (FPGAs)), and/or any other device or portion of a device that processes electronic data to transform that electronic data into other electronic data that may be stored in registers and/or memory.

Memory 516 and/or 536 may be examples of non-transitory computer-readable media. The memory 516 and/or 536 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 516 and/or memory 536 may store a perception component 518, localization component 520, planning component 522, map(s) 524, driving log data 526, prediction component 528, and/or system controller(s) 530—zero or more portions of any of which may be hardware, such as GPU(s), CPU(s), and/or other processing units. Simulation system 538 may represent simulator 124 or simulator 324.

The perception component 518 may detect object(s) in in an environment surrounding the vehicle 502 (e.g., identify that an object exists), classify the object(s) (e.g., determine an object type associated with a detected object), segment sensor data and/or other representations of the environment (e.g., identify a portion of the sensor data and/or representation of the environment as being associated with a detected object and/or an object type), determine characteristics associated with an object (e.g., a track identifying current, predicted, and/or previous position, heading, velocity, and/or acceleration associated with an object), and/or the like. Data determined by the perception component 518 is referred to as perception data. The perception component 518 may be configured to associate a bounding region (or other indication) with an identified object. The perception component 518 may be configured to associate a confidence score associated with a classification of the identified object with an identified object. In some examples, objects, when rendered via a display, can be colored based on their perceived class. The object classifications determined by the perception component 518 may distinguish between different object types such as, for example, a passenger vehicle, a pedestrian, a bicyclist, motorist, a delivery truck, a semi-truck, traffic signage, and/or the like.

In at least one example, the localization component 520 may include hardware and/or software to receive data from the sensor(s) 506 to determine a position, velocity, and/or orientation of the vehicle 502 (e.g., one or more of an x-, y-, z-position, roll, pitch, or yaw). For example, the localization component 520 may include and/or request/receive map(s) 524 of an environment and can continuously determine a location, velocity, and/or orientation of the autonomous vehicle 502 within the map(s) 524. In some instances, the localization component 520 may utilize SLAM (simultaneous localization and mapping), CLAMS (calibration, localization and mapping, simultaneously), relative SLAM, bundle adjustment, non-linear least squares optimization, and/or the like to receive image data, lidar data, radar data, IMU data, GPS data, wheel encoder data, and the like to accurately determine a location, pose, and/or velocity of the autonomous vehicle. In some instances, the localization component 520 may provide data to various components of the vehicle 502 to determine an initial position of an autonomous vehicle for generating a trajectory and/or for generating map data, as discussed herein. In some examples, localization component 520 may provide, to the perception component 518, a location and/or orientation of the vehicle 502 relative to the environment and/or sensor data associated therewith.

The planning component 522 may receive a location and/or orientation of the vehicle 502 from the localization component 520 and/or perception data from the perception component 518 and may determine instructions for controlling operation of the vehicle 502 based at least in part on any of this data. In some examples, determining the instructions may comprise determining the instructions based at least in part on a format associated with a system with which the instructions are associated (e.g., first instructions for controlling motion of the autonomous vehicle may be formatted in a first format of messages and/or signals (e.g., analog, digital, pneumatic, kinematic) that the system controller(s) 530 and/or drive component(s) 512 may parse/cause to be carried out, second instructions for the emitter(s) 508 may be formatted according to a second format associated therewith).

The driving log data 526 may comprise sensor data, perception data, and/or scenario labels collected/determined by the vehicle 502 (e.g., by the perception component 518), as well as any other message generated and or sent by the vehicle 502 during operation including, but not limited to, control messages, error messages, etc. In some examples, the vehicle 502 may transmit the driving log data 526 to the computing device(s) 532. The computing device(s) 532 may identify one or more scenarios based at least in part on the log data, which may also comprise defining a scenario, wherein the scenarios are used to generate a playback simulation. For example, the computing device(s) 532 may determine an environmental layout, a number, type, and a configuration of object(s) in the environment and/or associate this definition with one or more portions of log data associated with that scenario. In some examples, the driving log data 526 may comprise (historical) perception data that was generated on the vehicle 502 during operation of the vehicle.

The prediction component 528 may generate one or more probability maps representing prediction probabilities of possible locations of one or more objects in an environment. For example, the prediction component 528 may generate one or more probability maps for vehicles, pedestrians, animals, and the like within a threshold distance from the vehicle 502. In some examples, the prediction component 528 may measure a track of an object and generate a discretized prediction probability map, a heat map, a probability distribution, a discretized probability distribution, and/or a trajectory for the object based on observed and predicted behavior. In some examples, the one or more probability maps may represent an intent of the one or more objects in the environment. In some examples, the planner component 522 may be communicatively coupled to the prediction component 528 to generate predicted trajectories of objects in an environment. For example, the prediction component 528 may generate one or more predicted trajectories for objects within a threshold distance from the vehicle 502. In some examples, the prediction component 528 may measure a trace of an object and generate a trajectory for the object based on observed and predicted behavior. Although prediction component 528 is shown on a vehicle 502 in this example, the prediction component 528 may also be provided elsewhere, such as in a remote computing device as shown in FIG. 3. In some embodiments, a prediction component may be provided at both a vehicle and a remote computing device. These components may be configured to operate according to the same or a similar algorithm.

The memory 516 and/or 536 may additionally or alternatively store a mapping system, a planning system, a ride management system, etc. Although perception component 518 and/or planning component 522 are illustrated as being stored in memory 516, perception component 518 and/or planning component 522 may include processor-executable instructions, machine-learned model(s) (e.g., a neural network), and/or hardware.

As described herein, the localization component 520, the perception component 518, the planning component 522, the simulation system 538, and/or other components of the system 500 may comprise one or more ML models. For example, the localization component 520, the perception component 518, the planning component 522, and/or the simulation system 538 may each comprise different ML model pipelines. In some examples, an ML model may comprise a neural network. An exemplary neural network is a biologically inspired algorithm which passes input data through a series of connected layers to produce an output. Each layer in a neural network can also comprise another neural network, or can comprise any number of layers (whether convolutional or not). As can be understood in the context of this disclosure, a neural network can utilize machine-learning, which can refer to a broad class of such algorithms in which an output is generated based on learned parameters.

Although discussed in the context of neural networks, any type of machine-learning can be used consistent with this disclosure. For example, machine-learning algorithms can include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAD)), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet-50, ResNet-101, VGG, DenseNet, PointNet, and the like. In some examples, the ML model discussed herein may comprise PointPillars, SECOND, top-down feature layers (e.g., see U.S. patent application Ser. No. 15/963,833, which is incorporated in its entirety herein), and/or VoxelNet. Architecture latency optimizations may include MobilenetV2, Shufflenet, Channelnet, Peleenet, and/or the like. The ML model may comprise a residual block such as Pixor, in some examples.

Memory 520 may additionally or alternatively store one or more system controller(s) 530, which may be configured to control steering, propulsion, braking, safety, emitters, communication, and other systems of the vehicle 502. These system controller(s) 530 may communicate with and/or control corresponding systems of the drive component(s) 512 and/or other components of the vehicle 502.

It should be noted that while FIG. 5 is illustrated as a distributed system, in alternative examples, components of the vehicle 502 may be associated with the computing device(s) 532 and/or components of the computing device(s) 532 may be associated with the vehicle 502. That is, the vehicle 502 may perform one or more of the functions associated with the computing device(s) 532, and vice versa.

EXAMPLE CLAUSES

A: a system comprising: one or more processors; and memory storing processor-executable instructions that, when executed by the one or more processors, cause the system to perform actions including: accessing at least a first driving log comprising data gathered by a first autonomous vehicle traversing a first physical environment, the data relating to a first physical object in the first physical environment; generating a first driving simulation based on the first driving log, wherein the first driving simulation comprises a first simulated autonomous vehicle in a first simulated environment that represents the first autonomous vehicle in the first physical environment, wherein the first simulated autonomous vehicle is controlled according to the first driving log to mimic the actions of the first autonomous vehicle, and wherein the first driving simulation comprises a first simulated object in the first simulated environment that represents the first physical object in the first physical environment, wherein the first simulated object is controlled, at least in part, by an object controller according to an object behavior profile, wherein the object behavior profile includes one or more attributes indicating a behavior of the first simulated object in the first driving simulation; determining, based on the first driving simulation, a simulated behavior distribution for a parameter associated with at least the first simulated object, wherein the parameter varies based on the one or more attributes of the object behavior profile; determining, based on the first driving log, a real behavior distribution for the parameter for at least the first physical object; determining, based at least in part on comparing the simulated behavior distribution and the real behavior distribution, a metric; and modifying the one or more attributes to minimize the metric, indicating that the behaviors of at least the first simulated object and the first physical object are more closely aligned.

B: a system as clause A describes, wherein the instructions further cause the system to perform actions including: generating a further driving simulation in which at least one object is controlled according to a behavior profile comprising the one or more modified attributes; modifying one or more components of the first autonomous vehicle based on the further driving simulation to improve operation of the first autonomous vehicle.

C: a system as clause A or clause B describe, wherein the simulated behavior distribution comprises a plurality of values for the parameter for the first simulated object at a plurality of sample points during the first driving simulation, and the real behavior distribution comprises a plurality of values for the parameter for the first physical object at corresponding sample points during the first driving log, and wherein the metric indicates a correlation between the behavior of the first simulated object and the first physical object within a single journey performed by the first autonomous vehicle.

D: a system as clause A or clause B describe: the data in the first driving log relates to a second physical object in the first physical environment; the first driving simulation further comprises a second simulated object in the first simulated environment that represents the second physical object in the first physical environment, wherein the second simulated object is controlled, at least in part, by the object controller according to the object behavior profile, wherein the one or more attributes of the object behavior profile also indicate a behavior of the second simulated object in the first driving simulation; the simulated behavior distribution is determined for the second simulated object; the real behavior distribution for the parameter is determined for the second physical object; and the metric indicates a correlation between the behavior of at least the first and second simulated objects and the behavior at least the first and second physical objects within a single journey performed by the first autonomous vehicle.

E: a system as clause A or clause B describe, wherein the instructions further cause the system to perform actions including: accessing at least a second driving log comprising data gathered by a second autonomous vehicle traversing a second physical environment, the data relating to a second physical object in the second physical environment; and generating a second driving simulation based on the second driving log, wherein the second driving simulation comprises a second simulated autonomous vehicle in a second simulated environment that represents the second autonomous vehicle in the second physical environment, wherein the second simulated autonomous vehicle is controlled according to the second driving log to mimic the actions of the second autonomous vehicle, and wherein the second driving simulation comprises a second simulated object in the second simulated environment that represents the second physical object in the second physical environment, wherein the second simulated object is controlled, at least in part, by the object controller according to the object behavior profile, wherein the one or more attributes of the object behavior model also indicate a behavior of the second simulated object in the second driving simulation, wherein: the simulated behavior distribution for the parameter is determined for the second simulated object and is based on the second driving simulation; the real behavior distribution for the parameter is determined for the second physical object and is based on the second driving log; and the metric indicates a correlation between the behavior of at least the first and second simulated objects and the behavior of the first and second physical objects within a plurality of journeys performed by one or more autonomous vehicles.

F: a system comprising: one or more processors; and non-transitory memory storing processor-executable instructions that, when executed by the one or more processors, cause the system to perform actions including: receiving a real-world driving log comprising data relating to a real-world object in a real-world environment; controlling, in a driving simulation generated based at least in part on the real-world driving log, a simulated object corresponding to the real-world object according to an object model in a simulated environment; determining a simulated distribution for a characteristic that is controlled according to the object model, the simulated distribution being based on at least one value for the characteristic associated with the simulated object based on the driving simulation; determining a real distribution for the characteristic, the real distribution being based on at least one value for the characteristic associated with the real-world object based on the real-world driving log; and determining a metric based on the simulated distribution and the real distribution.

G: a system as clause F describes, wherein the instructions further cause the system to perform actions including: modifying the object model based on the metric; controlling, in a further driving simulation, the simulated object according to the object model modified based on the metric; determining, the simulated distribution based on the further driving simulation; determining a further metric based on the further simulated distribution and the real distribution; and comparing the metric and the further metric.

H: a system as clause F or clause G describe, wherein the instructions further cause the system to perform actions including: modifying the object model based on the metric; controlling, in a further driving simulation, the simulated object according to the object model modified based on the metric; and determining a modification to one or more hardware or software components of an autonomous vehicle based on the further driving simulation.

I: a system as clause H describes, wherein the instructions further cause the system to perform actions including: determining, based on the real-world driving log, a condition associated with the real-world environment; implementing the modification to the one or more hardware or software components when the condition is present in a real-world environment in which the autonomous vehicle is driving.

J: a system as any of clauses F to I describe, wherein the data in the real-world driving log relates to a plurality of static real-world objects, wherein the object model positions a plurality of static simulated object corresponding to the plurality of static real-world objects in the simulated environment, and wherein characteristic relates to a position and/or frequency of the plurality of static objects within the real-world and simulated environments respectively.

K: a system as any of clauses F to J describe, wherein the object model comprises an object behavior model, wherein the simulated distribution is based on a plurality of values for the characteristic associated with the simulated object determined at a plurality of sample points during the driving simulation, and wherein the real distribution is based on a plurality of values for the characteristic associated with the real object determined at a corresponding plurality of sample points during the real-world driving log.

L: a system as any of clauses F to K describe, wherein the object model comprises an object behavior model, wherein the real-world driving log comprises data relating to a further real-world object in the real-world environment, and wherein the instructions further cause the system to perform actions including: controlling, in the driving simulation, a further simulated object corresponding to the further real-world object according to the object model in the simulated environment; determining the simulated distribution based on at least one value for the characteristic associated with the further simulated object based on the driving simulation; and determining the real distribution based on at least one value for the characteristic associated with the further real-world object based on the real-world driving log.

M: a system as any of clauses F to L describe, wherein the object model comprises an object behavior model, and wherein the instructions further cause the system to perform actions including: receiving a further real-world driving log comprising further data relating to a further real-world object in a further real-world environment; controlling, in a further driving simulation generated based at least in part on the further real-world driving log, a further simulated object corresponding to the further real-world object according to the object model in a further simulated environment; determining the simulated distribution based on at least one value for the characteristic associated with the further simulated object based on the further driving simulation; and determining the real distribution based on at least one value for the characteristic associated with the further real-world object based on the real-world driving log.

N: a system as any of clauses F to M describe, wherein the instructions further cause the system to perform actions including: determining a further characteristic that is correlated with the characteristic in the real-world driving log; determining a further simulated distribution for a further characteristic that is controlled according to the object model, the further simulated distribution being based on at least one value for the further characteristic associated with the further simulated object based on the driving simulation; determining a further real distribution for the further characteristic, the further real distribution being based on at least one value for the further characteristic associated with the real-world object based on the real-world driving log; and determining the metric based on the further simulated distribution and the further real distribution.

O: a system as any of clauses F to N describe, wherein the metric is based on at least one of: a median value for the simulated distribution and of the real distribution; a mean value for the simulated distribution and of the real distribution; a range of the simulated distribution and of the real distribution; a standard deviation for the simulated distribution and of the real distribution; or an earth movers distance between the simulated distribution and of the real distribution.

P: a system as any of clauses F to O describe, wherein the characteristic comprises one of: a speed; an acceleration; a following distance; a stopped separation distance; a turning speed; or a time to perform a maneuver.

Q: one or more non-transitory computer-readable media storing instructions executable by a processor, wherein the instructions, when executed, cause the processor to perform actions including: receiving a real-world driving log comprising data relating to a real-world object in a real-world environment; controlling, in a driving simulation generated based at least in part on the real-world driving log, a simulated object corresponding to the real-world object according to an object model in a simulated environment; determining a simulated distribution for a characteristic that is controlled according to the object model, the simulated distribution being based on at least one value for the characteristic associated with the simulated object based on the driving simulation; determining a real distribution for the characteristic, the real distribution being based on at least one value for the characteristic associated with the real-world object based on the real-world driving log; and determining a metric based on the simulated distribution and the real distribution.

R: one or more non-transitory computer-readable media as clause Q describes, wherein the instructions cause the processor to perform actions including: modifying the object model based on the metric; and controlling, in a further driving simulation, the simulated object according to the object model modified based on the metric; determining a modification to one or more hardware or software components of an autonomous vehicle based on the further driving simulation; determining, based on the real-world driving log, a condition associated with the real-world environment; and implementing the modification to the one or more hardware or software components when the condition is present in a real-world environment in which the autonomous vehicle is driving.

S: one or more non-transitory computer-readable media as clause Q or clause R describe, wherein the metric is based on at least one of: a median value for the simulated distribution and of the real distribution; a mean value for the simulated distribution and of the real distribution; a range of the simulated distribution and of the real distribution; a standard deviation for the simulated distribution and of the real distribution; or an earth movers distance between the simulated distribution and of the real distribution.

T: one or more non-transitory computer-readable media as any of clauses Q to S describe, wherein the characteristic comprises one of: a speed; an acceleration; a following distance; a stopped separation distance; a turning speed; or a time to perform a maneuver.

U: a system comprising: one or more processors; and memory storing processor-executable instructions that, when executed by the one or more processors, configure the system to: generate a driving simulation comprising a simulated autonomous vehicle in a simulated environment, which represents a real autonomous vehicle in a real environment, and a simulated object in the simulated environment, which represents a real object in the real environment; determine, by a simulated perception component that corresponds to a real perception component of the real autonomous vehicle, first simulated perception data relating to the simulated object at a first time in the driving simulation, wherein the simulated perception data indicates at least a position of the simulated object in the simulated environment relative to the simulated autonomous vehicle at the first time and has a predetermined data format that corresponds to a format of real perception data output from the real perception component of the real autonomous vehicle; determine, by a prediction component that is configured for use by the real autonomous vehicle and configured to receive data in the predetermined data format, a predicted trajectory of the simulated object in the simulated environment between the first time and a second, later time based on the first simulated perception data; control, in the driving simulation, the simulated object to traverse the simulated environment between the first and second points in time, wherein the simulated object is controlled to traverse the simulated environment, at least in part, by an object controller according to an object behavior profile, wherein the object behavior profile includes one or more attributes indicating a behavior of the simulated object in the driving simulation; determine, by the simulated perception component, second simulated perception data relating to the simulated object at the second time in the driving simulation, wherein the second simulated perception data indicates at least a position of the simulated object in the simulated environment relative to the simulated autonomous vehicle at the second time; determine, based on the first simulated perception data and the second simulated perception data, a simulated trajectory of the simulated object; determine, based at least in part on comparing the simulated trajectory and the predicted trajectory, a metric; and modify the one or more attributes to minimize the metric, indicating that the simulated and predicted trajectories of the first simulated object are more closely aligned.

V: a system as clause U describes, wherein the instructions further configure the system to: generate a further driving simulation in which at least one object is controlled according to a behavior profile comprising the one or more modified attributes; modifying one or more components of a real autonomous vehicle based on the further driving simulation to improve operation of the real autonomous vehicle.

W: a system as clause U or clause V describe, wherein the metric is based on at least one of: a difference between a position of the simulated object at the second time in the simulated trajectory and the predicted trajectory or at a third time between the first time and the second time in the simulated trajectory and the predicted trajectory; a difference in orientation of the simulated object at the second time in the simulated trajectory and the predicted trajectory or at a third time between the first time and the second time in the simulated trajectory and the predicted trajectory; an average difference in the position of the simulated object along at least a portion of the simulated trajectory and the predicted trajectory; a difference in a shape of the simulated trajectory and the predicted trajectory; or a difference in a length of the simulated trajectory and the predicted trajectory.

X: a system as any of clauses U to W describe, wherein the instructions further configure the system to: determine, by the prediction component, a plurality of predicted trajectories of the simulated object in the simulated environment between the first time and the second time and a plurality of associated probabilities that a predicted trajectory will be followed by the simulated object based on the simulated perception data; determine, based on the plurality of predicted trajectories and plurality of associated probabilities, a predicted distribution of trajectories; control, in a plurality of driving simulations, the simulated object to traverse the simulated environment between the first and second points in time, wherein the simulated object is controlled in the driving simulations to traverse the simulated environment, at least in part, by the object controller according to the object behavior profile, wherein the object behavior profile includes one or more attributes indicating a behavior of the simulated object in the driving simulation; determine, by the simulated perception component, second simulated perception data relating to the simulated object at the second time in the plurality of driving simulations; determine, based on the first simulated perception data and the second simulated perception data for the plurality of driving simulations, a plurality of simulated trajectories of the simulated object; determine, based on the plurality of simulated trajectories, a simulated distribution of trajectories; and determining, based at least in part on comparing the simulated distribution and the predicted distribution, the metric.

Y: a system as clause X describes, wherein the metric is based on at least one of: a median value for the simulated distribution and the predicted distribution; a mean value for the simulated distribution and the predicted distribution; a range of the simulated distribution and the predicted distribution; a standard deviation for the simulated distribution and the predicted distribution; or an earth movers distance between the simulated distribution and the predicted distribution.

Z: a system comprising: one or more processors; and non-transitory memory storing processor-executable instructions that, when executed by the one or more processors, cause the system to perform actions including: generating a driving simulation comprising a simulated autonomous vehicle and a simulated object in a simulated environment; determining, using a prediction component configured for use by a real autonomous vehicle, a predicted trajectory of the simulated object within the simulated environment, based at least in part on the driving simulation; running the driving simulation, wherein the simulated object is controlled by an object controller to traverse the simulated environment according to an object behavior model; determining a simulated trajectory of the simulated object based at least in part on the driving simulation; comparing the predicted trajectory of the simulated trajectory; and determining a value of a metric based on the predicted trajectory and the simulated trajectory.

AA: a system as clause Z describes, wherein the instructions further cause the system to perform actions including: modifying the object behavior model based on the metric; rerunning the driving simulation in which the simulated object is controlled according to the object model modified based on the metric; determining at least a new simulated trajectory based on the rerun driving simulation; determining a new metric based on the new simulated trajectory; and comparing the metric and the new metric.

AB: a system as clause Z or clause AA describe, wherein the instructions further cause the system to perform actions including: modifying the object behavior model based on the metric; controlling, in a further driving simulation, the simulated object according to the object behavior model modified based on the metric; and implementing a modification to one or more hardware or software components of a real autonomous vehicle based on the further driving simulation.

AC: a system as any of clauses Z to AB describe, wherein the metric is based on one or more of: corresponding positions of the simulated object on the simulated trajectory and on the predicted trajectory; an orientation of the simulated object at corresponding positions on the simulated trajectory and on the predicted trajectory; an average position of the simulated object along at least a portion of the simulated trajectory and the predicted trajectory; or a shape of the simulated trajectory and of the predicted trajectory; or a length of the simulated trajectory and of the predicted trajectory.

AD: a system as any of clauses Z to AC describe, wherein the instructions further cause the system to perform actions including: determining, using the prediction component, a further predicted trajectory of the simulated object within the simulated environment, based on the driving simulation, a probability value associated with the predicted trajectory; and determining the value of the metric based on the further predicted trajectory.

AE: a system as any of clauses Z to AD describe, wherein the instructions further cause the system to perform actions including: rerunning the driving simulation; determining a further simulated trajectory of the simulated object based on the rerun driving simulation; and determining the value of the metric based on the further simulated trajectory.

AF: a system as clause AE describes, wherein the instructions further cause the system to perform actions including: determining, based on the simulated trajectory and the further simulated trajectory, a simulated trajectory distribution; determining, based on the predicted trajectory and the further predicted trajectory, a predicted trajectory distribution; and determining the value of the metric based on the simulated trajectory distribution and the predicted trajectory distribution.

AG: a system as any of clauses AD to AF describe, wherein the instructions further cause the system to perform actions including: determining, using the prediction component, a first predicted trajectory probability value associated with the predicted trajectory and a second predicted trajectory probability value associated with the further predicted trajectory; and determining the value of the metric based on the first predicted trajectory probability value and the second predicted trajectory probability value.

AH: a system as any of clauses Z to AG describe, wherein the driving simulation comprises a further simulated object and the further simulated object is controlled in the driving simulation by the object controller to traverse the simulated environment according to the object behavior model, wherein the instructions further cause the system to perform actions including: determining, using the prediction component, a further predicted trajectory of the further simulated object within the simulated environment, based on the driving simulation; determining a further simulated trajectory of the further simulated object based on the driving simulation; and determining the value of the metric based the further predicted trajectory and the further simulated trajectory.

AI: a system as clause AH describes, wherein the instructions further cause the system to perform actions including: determining, based on the simulated trajectory and the further simulated trajectory, a simulated trajectory distribution; determining, based on the predicted trajectory and the further predicted trajectory, a predicted trajectory distribution; and determining the value of the metric based on the predicted trajectory distribution.

AJ: a system as clause AI describes, wherein the metric is based on at least one of: a median value for the simulated distribution and of the predicted distribution; a mean value for the simulated distribution and of the predicted distribution; a range of the simulated distribution and of the predicted distribution; a standard deviation for the simulated distribution and of the predicted distribution; or an earth movers distance between the simulated distribution and the predicted distribution.

AK: one or more non-transitory computer-readable media storing instructions executable by a processor, wherein the instructions, when executed, cause the processor to perform actions including: generating a driving simulation comprising a simulated autonomous vehicle and a simulated object in a simulated environment; determining, using a prediction component configured for use by a real autonomous vehicle, a predicted trajectory of the simulated object within the simulated environment, based at least in part on the driving simulation; running the driving simulation, wherein the simulated object is controlled by an object controller to traverse the simulated environment according to an object behavior model; determining a simulated trajectory of the simulated object based at least in part on the driving simulation; comparing the predicted trajectory of the simulated trajectory; and determining a value of a metric based on the predicted trajectory and the simulated trajectory.

AL: one or more non-transitory computer-readable media as clause AK describes, wherein the instructions cause the processor to perform actions including: modifying the object behavior model based on the metric; controlling, in a further driving simulation, the simulated object according to the object behavior model modified based on the metric; and implementing a modification to one or more hardware or software components of a real autonomous vehicle based on the further driving simulation.

AM: one or more non-transitory computer-readable media as clause AK or clause AL describe, wherein the instructions cause the processor to perform actions including classifying the simulated object as a behavioral type of several behavioral types, wherein each of the several behavioral types corresponds to a respective different behavioral model.

AN: one or more non-transitory computer-readable media as any of clauses AK to AM describe, wherein the instructions cause the processor to perform actions including: determining, using the prediction component, a further predicted trajectory of the simulated object within the simulated environment, based on the driving simulation, and a probability value associated with the predicted trajectory; and rerunning the driving simulation; determining a further simulated trajectory of the simulated object based on the rerun driving simulation; determining, based on the simulated trajectory and the further simulated trajectory, a simulated trajectory distribution; determining, based on the predicted trajectory and the further predicted trajectory, a predicted trajectory distribution; and determining the value of the metric based on the simulated trajectory distribution and the predicted trajectory distribution.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into subcomputations with the same results.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code components and/or computer-executable instructions executed by one or more computers or processors, hardware, or some combination thereof. Some or all of the methods may alternatively be embodied in specialized computer hardware.

At least some of the processes discussed herein are illustrated as logical flow charts, each operation of which represents a sequence of operations that can be implemented in hardware, software, or a combination thereof. In the context of software, the operations represent computer-executable instructions stored on one or more non-transitory computer-readable storage media that, when executed by one or more processors, cause a computer or autonomous vehicle to perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art. Note that the term substantially may indicate a range. For example, substantially simultaneously may indicate that two activities occur within a time range of each other, substantially a same dimension may indicate that two elements have dimensions within a range of each other, and/or the like.

Many variations and modifications may be made to the above-described examples, the elements of which are to be understood as being among other acceptable examples. All such modifications and variations are intended to be included herein within the scope of this disclosure and protected by the following claims.

What is claimed is:

1. A system comprising:

one or more processors; and memory storing processor-executable instructions that, when executed by the one or more processors, cause the system to perform actions including:

accessing at least a first driving log comprising data gathered by a first autonomous vehicle traversing a first physical environment, the data relating to a first physical object in the first physical environment;

generating a first driving simulation based on the first driving log, wherein the first driving simulation comprises a first simulated autonomous vehicle in a first simulated environment that represents the first autonomous vehicle in the first physical environment, wherein the first simulated autonomous vehicle is controlled according to the first driving log to mimic the actions of the first autonomous vehicle, and wherein the first driving simulation comprises a first simulated object in the first simulated environment that represents the first physical object in the first physical environment, wherein the first simulated object is controlled, at least in part, by an object controller according to an object behavior profile, wherein the object behavior profile includes one or more attributes configuring the first simulated object to perform a first type of driving behavior in the first driving simulation;

determining, based on the first driving simulation, a simulated behavior distribution for a parameter associated with at least the first simulated object, wherein the parameter varies based on the one or more attributes of the object behavior profile;

determining, based on the first driving log, a real behavior distribution for the parameter for at least the first physical object;

determining a metric representing a difference between the simulated behavior distribution and the real behavior distribution; and modifying the one or more attributes to minimize the metric, indicating that the behaviors of at least the first simulated object and the first physical object are more closely aligned.

2. The system of claim 1, wherein the instructions further cause the system to perform actions including:

generating a further driving simulation in which at least one object is controlled according to a behavior profile comprising the one or more modified attributes; and modifying one or more components of the first autonomous vehicle based on the further driving simulation to improve operation of the first autonomous vehicle.

3. The system of claim 1, wherein the simulated behavior distribution comprises a plurality of values for the parameter for the first simulated object at a plurality of sample points during the first driving simulation, and the real behavior distribution comprises a plurality of values for the parameter for the first physical object at corresponding sample points during the first driving log, and wherein the metric indicates a correlation between the behavior of the first simulated object and the first physical object within a single journey performed by the first autonomous vehicle.

4. The system of claim 1, wherein:

the data in the first driving log relates to a second physical object in the first physical environment;

the first driving simulation further comprises a second simulated object in the first simulated environment that represents the second physical object in the first physical environment, wherein the second simulated object is controlled, at least in part, by the object controller according to the object behavior profile, wherein the one or more attributes of the object behavior profile configure the second simulated object to perform a type of driving behavior in the first driving simulation;

the simulated behavior distribution is determined for the second simulated object;

the real behavior distribution for the parameter is determined for the second physical object; and the metric indicates a correlation between the behavior of at least the first and second simulated objects and the behavior of at least the first and second physical objects within a single journey performed by the first autonomous vehicle.

5. The system of claim 1, wherein the instructions further cause the system to perform actions including:

accessing at least a second driving log comprising data gathered by a second autonomous vehicle traversing a second physical environment, the data relating to a second physical object in the second physical environment; and generating a second driving simulation based on the second driving log, wherein the second driving simulation comprises a second simulated autonomous vehicle in a second simulated environment that represents the second autonomous vehicle in the second physical environment, wherein the second simulated autonomous vehicle is controlled according to the second driving log to mimic the actions of the second autonomous vehicle, and wherein the second driving simulation comprises a second simulated object in the second simulated environment that represents the second physical object in the second physical environment, wherein the second simulated object is controlled, at least in part, by the object controller according to the object behavior profile, wherein the one or more attributes of the object behavior profile configure the second simulated object to perform a type of driving behavior in the second driving simulation, wherein:

the simulated behavior distribution for the parameter is determined for the second simulated object and is based on the second driving simulation;

the real behavior distribution for the parameter is determined for the second physical object and is based on the second driving log; and the metric indicates a correlation between the behavior of at least the first and second simulated objects and the behavior of the first and second physical objects within a plurality of journeys performed by one or more autonomous vehicles.

6. A system comprising:

one or more processors; and non-transitory memory storing processor-executable instructions that, when executed by the one or more processors, cause the system to perform actions including:

receiving a real-world driving log comprising data relating to a real-world autonomous vehicle and a real-world object in a real-world environment;

controlling, in a driving simulation generated based at least in part on the real-world driving log, a simulated autonomous vehicle to mimic the actions of the real-world autonomous vehicle, and a simulated object corresponding to the real-world object according to an object model in a simulated environment, wherein the object model includes an object behavior profile configuring the simulated object to perform a type of driving behavior in the driving simulation;

determining a simulated behavior distribution for a characteristic that is controlled according to the object model, the simulated behavior distribution being based on at least one value for the characteristic associated with the simulated object based on the driving simulation, wherein the at least one value varies based on the object behavior profile;

determining a real behavior distribution for the characteristic, the real behavior distribution being based on at least one value for the characteristic associated with the real-world object based on the real-world driving log;

determining a metric representing a difference between the simulated behavior distribution and the real behavior distribution; and modifying the object behavior profile to minimize the metric, indicating that the behaviors of at least the simulated object and the real-world object are more closely aligned.

7. The system of claim 6, wherein the instructions further cause the system to perform actions including:

modifying the object model based on the metric;

controlling, in a further driving simulation, the simulated object according to the object model modified based on the metric;

determining the simulated behavior distribution based on the further driving simulation;

determining a further metric based on the further simulated behavior distribution and the real behavior distribution; and comparing the metric and the further metric.

8. The system of claim 6, wherein the instructions further cause the system to perform actions including:

modifying the object model based on the metric;

controlling, in a further driving simulation, the simulated object according to the object model modified based on the metric; and determining a modification to one or more hardware or software components of an autonomous vehicle based on the further driving simulation.

9. The system of claim 8, wherein the instructions further cause the system to perform actions including:

determining, based on the real-world driving log, a condition associated with the real-world environment; and implementing the modification to the one or more hardware or software components when the condition is present in a real-world environment in which the autonomous vehicle is driving.

10. The system of claim 6, wherein the data in the real-world driving log relates to a plurality of static real-world objects, wherein the object model positions a plurality of static simulated objects corresponding to the plurality of static real-world objects in the simulated environment, and wherein the characteristic relates to a position and/or frequency of the plurality of static objects within the real-world and simulated environments respectively.

11. The system of claim 6, wherein the object model comprises an object behavior model, wherein the simulated behavior distribution is based on a plurality of values for the characteristic associated with the simulated object determined at a plurality of sample points during the driving simulation, and wherein the real behavior distribution is based on a plurality of values for the characteristic associated with the real-world object determined at a corresponding plurality of sample points during the real-world driving log.

12. The system of claim 6, wherein the object model comprises an object behavior model, wherein the real-world driving log comprises data relating to a further real-world object in the real-world environment, and wherein the instructions further cause the system to perform actions including:

controlling, in the driving simulation, a further simulated object corresponding to the further real-world object according to the object model in the simulated environment;

determining the simulated behavior distribution based on at least one value for the characteristic associated with the further simulated object based on the driving simulation; and determining the real behavior distribution based on at least one value for the characteristic associated with the further real-world object based on the real-world driving log.

13. The system of claim 6, wherein the object model comprises an object behavior model, and wherein the instructions further cause the system to perform actions including:

receiving a further real-world driving log comprising further data relating to a further real-world object in a further real-world environment;

controlling, in a further driving simulation generated based at least in part on the further real-world driving log, a further simulated object corresponding to the further real-world object according to the object model in a further simulated environment;

determining the simulated behavior distribution based on at least one value for the characteristic associated with the further simulated object based on the further driving simulation; and determining the real behavior distribution based on at least one value for the characteristic associated with the further real-world object based on the real-world driving log.

14. The system of claim 6, wherein the instructions further cause the system to perform actions including:

determining a further characteristic that is correlated with the characteristic in the real-world driving log;

determining a further simulated behavior distribution for a further characteristic that is controlled according to the object model, the further simulated behavior distribution being based on at least one value for the further characteristic associated with a further simulated object based on the driving simulation;

determining a further real behavior distribution for the further characteristic, the further real behavior distribution being based on at least one value for the further characteristic associated with the real-world object based on the real-world driving log; and determining the metric based on the further simulated behavior distribution and the further real behavior distribution.

15. The system of claim 6, wherein the metric is based on at least one of:

a median value for the simulated behavior distribution and of the real behavior distribution;

a mean value for the simulated behavior distribution and of the real behavior distribution;

a range of the simulated behavior distribution and of the real behavior distribution;

a standard deviation for the simulated distribution and of the real distribution; or an earth movers distance between the simulated behavior distribution and of the real behavior distribution.

16. The system of claim 6, wherein the characteristic comprises one of:

a speed;

an acceleration;

a following distance;

a stopped separation distance;

a turning speed; or a time to perform a maneuver.

17. One or more non-transitory computer-readable media storing instructions executable by a processor, wherein the instructions, when executed, cause the processor to perform actions including:

receiving a real-world driving log comprising data relating to a real-world autonomous vehicle and a real-world object in a real-world environment;

controlling, in a driving simulation generated based at least in part on the real-world driving log, a simulated autonomous vehicle to mimic the actions of the real-world autonomous vehicle, and a simulated object corresponding to the real-world object according to an object model in a simulated environment, wherein the object model includes an object behavior profile configuring the simulated object to perform a type of driving behavior in the driving simulation;

determining a simulated behavior distribution for a characteristic that is controlled according to the object model, the simulated behavior distribution being based on at least one value for the characteristic associated with the simulated object based on the driving simulation, wherein the at least one value varies based on the object behavior profile;

determining a real behavior distribution for the characteristic, the real behavior distribution being based on at least one value for the characteristic associated with the real-world object based on the real-world driving log;

determining a metric representing a difference between the simulated behavior distribution and the real behavior distribution; and modifying the object behavior profile to minimize the metric, indicating that the behaviors of at least the simulated object and the real-world object are more closely aligned.

18. The one or more non-transitory computer-readable media of claim 17, wherein the instructions cause the processor to perform actions including:

modifying the object model based on the metric;

controlling, in a further driving simulation, the simulated object according to the object model modified based on the metric;

determining a modification to one or more hardware or software components of an autonomous vehicle based on the further driving simulation;

determining, based on the real-world driving log, a condition associated with the real-world environment; and implementing the modification to the one or more hardware or software components when the condition is present in a real-world environment in which the autonomous vehicle is driving.

19. The one or more non-transitory computer-readable media of claim 17, wherein the metric is based on at least one of:

a median value for the simulated behavior distribution and of the real behavior distribution;

a mean value for the simulated behavior distribution and of the real behavior distribution;

a range of the simulated behavior distribution and of the real behavior distribution;

a standard deviation for the simulated behavior distribution and of the real behavior distribution; or an earth movers distance between the simulated behavior distribution and of the real behavior distribution.

20. The one or more non-transitory computer-readable media of claim 17, wherein the characteristic comprises one of:

a speed;

an acceleration;

a following distance;

a stopped separation distance;

a turning speed; or a time to perform a maneuver.

* * * * *